(12) United States Patent
Park et al.

(10) Patent No.: US 9,576,612 B2
(45) Date of Patent: Feb. 21, 2017

(54) NONVOLATILE MEMORY DEVICE

(71) Applicants: Ansoo Park, Suwon-Si (KR); In-Mo Kim, Hwaseong-Si (KR); Jung-Seok Hwang, Hwaseong-Si (KR)

(72) Inventors: Ansoo Park, Suwon-Si (KR); In-Mo Kim, Hwaseong-Si (KR); Jung-Seok Hwang, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/578,632

(22) Filed: Dec. 22, 2014

(65) Prior Publication Data

US 2015/0287437 A1    Oct. 8, 2015

(30) Foreign Application Priority Data

Apr. 7, 2014  (KR) ........................ 10-2014-0041155

(51) Int. Cl.
| | |
|---|---|
| G11C 5/02 | (2006.01) |
| G11C 5/06 | (2006.01) |
| G11C 8/14 | (2006.01) |
| G11C 13/00 | (2006.01) |
| G11C 16/08 | (2006.01) |
| G11C 11/16 | (2006.01) |
| G11C 11/22 | (2006.01) |
| H01L 27/115 | (2006.01) |

(52) U.S. Cl.
CPC .............. G11C 5/025 (2013.01); G11C 8/14 (2013.01); G11C 11/1657 (2013.01); G11C 11/2257 (2013.01); G11C 13/0028 (2013.01); G11C 16/08 (2013.01); G11C 2213/71 (2013.01); H01L 27/11582 (2013.01)

(58) Field of Classification Search
None
See application file for complete search history.

(56) References Cited

U.S. PATENT DOCUMENTS

| | | | |
|---|---|---|---|
| 5,517,457 A * | 5/1996 | Sakui | G11C 5/025 |
| | | | 365/230.01 |
| 5,777,924 A | 7/1998 | Lee et al. | |
| 6,972,996 B2 | 12/2005 | Hosono et al. | |
| 7,133,314 B2 | 11/2006 | Futatsuyama et al. | |
| 7,151,686 B2 | 12/2006 | Sugimae et al. | |
| 7,313,009 B2 | 12/2007 | Futatsuyama | |
| 7,940,578 B2 | 5/2011 | Kang et al. | |
| 8,233,325 B2 | 7/2012 | Sakurai et al. | |
| 8,274,826 B2 | 9/2012 | Hashimoto et al. | |
| 2012/0257452 A1 | 10/2012 | Kim et al. | |
| 2013/0229871 A1 | 9/2013 | Li | |

FOREIGN PATENT DOCUMENTS

KR     10-0723770 B1     5/2007

* cited by examiner

Primary Examiner — James G Norman
(74) Attorney, Agent, or Firm — Volentine & Whitt, PLLC

(57) ABSTRACT

A nonvolatile memory device includes a first memory block connected to first word lines, a second memory block arranged in a direction perpendicular to the first memory block and is connected to second word lines, first pass transistors for enabling the first word lines, and second pass transistors for enabling the second word lines. The first and second pass transistors are arranged in a horizontal direction with respect to the first and second memory blocks.

19 Claims, 20 Drawing Sheets

NONVOLATILE MEMORY DEVICE

PRIORITY STATEMENT

This U.S. non-provisional patent application claims priority under 35 U.S.C. §119 to Korean Patent Application No. 10-2014-0041155, filed on Apr. 7, 2014, the entire contents of which are hereby incorporated by reference.

BACKGROUND

The present inventive concept relates to semiconductor memories. More particularly, the inventive concept relates to a nonvolatile semiconductor memory device.

Semiconductor memory devices use the semiconducting properties of such materials as silicon (Si), germanium (Ge), gallium arsenide (GaAs), indium phosphide (InP), etc., to store data. Semiconductor memory devices may be classified as volatile or nonvolatile semiconductor memory devices.

A volatile semiconductor memory device loses its stored data when its power supply is interrupted. Examples of volatile semiconductor memory devices are a static RAM (SRAM), a dynamic RAM (DRAM), and a synchronous DRAM (SDRAM). A nonvolatile memory device retains its stored data even when its power supply is interrupted. Examples of nonvolatile semiconductor memory devices are a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), and a ferroelectric RAM (FRAM). A flash memory may be classified as a NOR type flash memory or a NAND type flash memory.

As a way to increase the degree to which semiconductor memory devices may be integrated, a semiconductor memory device having a three-dimensional array structure is being studied.

SUMMARY

According to an aspect of the inventive concept, there is provided a nonvolatile memory device including first word lines and second word lines, a first memory block electrically connected to the first word lines, a second memory block electrically connected to the second word lines, the second memory block adjacent the first memory block in a first horizontal direction, first pass transistors enabling a selection of the first word lines, and second pass transistors enabling a selection of the second word lines, and in which the first transistors and the second pass transistors are disposed beside the memory blocks and are arrayed in parallel rows, each of the rows extending in a second horizontal direction different from the first horizontal direction.

According to another aspect of the inventive concept, there is provided a nonvolatile memory device including a plurality of word lines, a group of memory blocks connected to the plurality of word lines, and a plurality of pass transistor units enabling the memory blocks, respectively, and in which each of the pass transistor units is disposed beside the group of memory blocks so as to face the group of memory blocks in a horizontal direction.

According to an aspect of the inventive concept, there is provided a nonvolatile memory device including a memory cell array comprising blocks of cell strings, groups of word lines connected to the blocks, respectively, a block gating unit including a plurality of circuits of pass transistors, and in which the blocks of cell strings are disposed side by side in a first horizontal direction, each of the cell strings includes a vertical stack of memory transistors arranged such that each of the blocks of cell strings has a plurality of the memory transistors located at each of a plurality of levels in the memory device, the word lines of each group are electrically connected to the memory transistors of a respective one of the blocks of cell strings, each of the circuits of pass transistors is connected to one of the blocks of cell strings, respective ones of the pass transistors of the block gating unit are connected to the groups of word lines, each of the circuits of pass transistors is disposed beside the blocks of cell strings along a second horizontal direction perpendicular to the first horizontal direction, and all of said pass transistors are disposed at the same level as one another in the memory device as arrayed in rows and columns in the first and second horizontal directions, respectively.

BRIEF DESCRIPTION OF THE FIGURES

Preferred embodiments of the inventive concept will be described below in more detail with reference to the accompanying drawings.

DETAILED DESCRIPTION OF PREFERRED EMBODIMENTS

Figure 1:
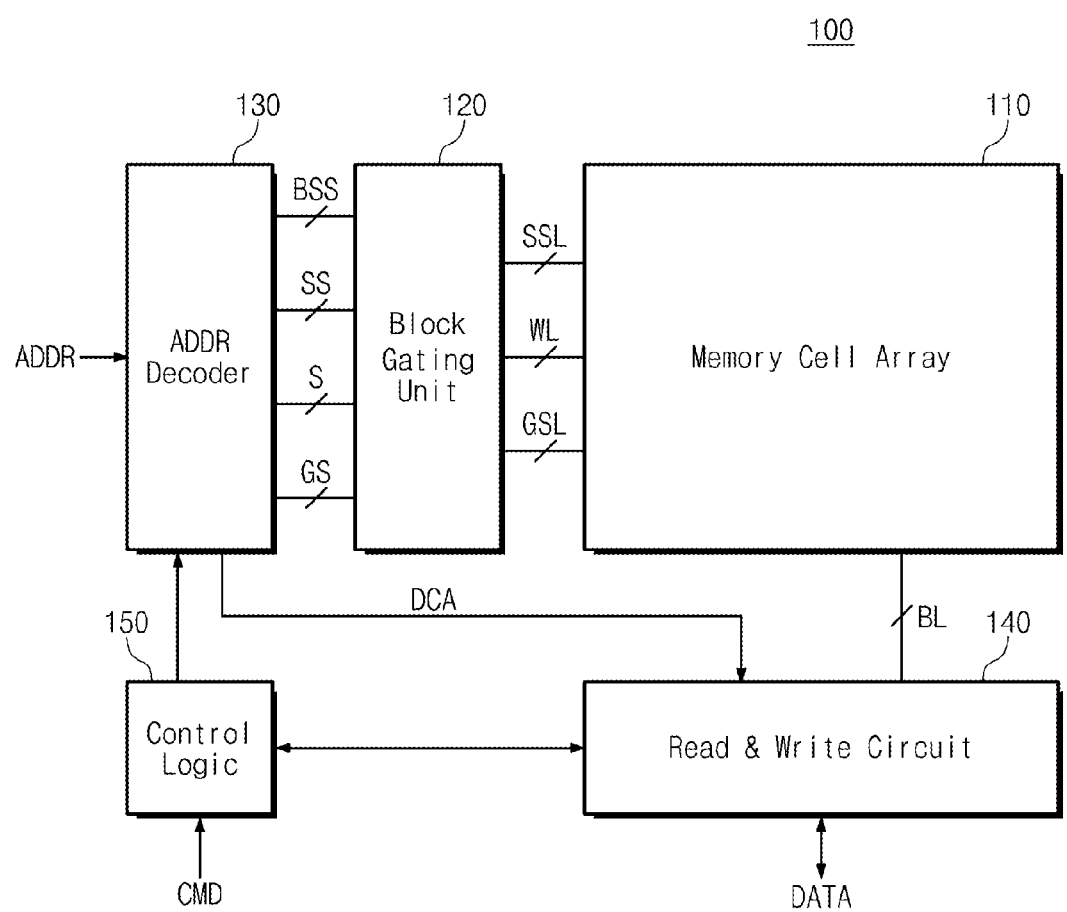
FIG. 1 is a block diagram of a nonvolatile memory device in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices are schematic. Also, like numerals may be used to designate like elements throughout the drawings.

Furthermore, terms such as "upper" and "lower" are used to describe an element's and/or feature's relationship to another element(s) and/or feature(s) or as illustrated in the figures and terms such as "horizontal" are used to describe the orientation illustrated in the figures. Thus, the terms are merely spatially relative terms and given the right frame of reference apply to orientations in use other than that depicted in the figures.

It will also be understood that although the terms first, second, third etc. are used herein to describe various elements, regions, layers, etc., these elements, regions, and/or layers are not limited by these terms. These terms are only used to distinguish one element, layer or region from another. Thus, whereas the term "third direction" may be used in the written description to distinguish that direction from previously mentioned first and second directions, the same direction if mentioned first in the claims may be recited in the claims as the "first direction". Dimensions of a block, circuit, unit, etc. in a particular direction will generally refer to the dimensions of the area or footprint of that block, circuit, unit, as viewed in plan.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" will generally be used to denote the lengthwise or longitudinal direction of a particular element or feature. The term "connected" will generally refer to an electrical or electronic connection even A nonvolatile memory device will be used as an example of a storage device or an electronic device according to the inventive concept. In particular, a NAND flash memory is described but the inventive concept may be applied to other nonvolatile memory devices such as a PRAM, a MRAM, an ReRAM, a FRAM, or a NOR flash memory, as well as to systems in which different kinds of memory devices are used together.

Referring now to FIG. 1, a nonvolatile memory device 100 according to the inventive concept may include a memory cell array 110, a block gating unit 120, an address decoder 130, a read & write circuit 140 and control logic 150.

The memory cell array 110 may include a plurality of memory blocks. Each memory block may include a plurality of cell strings arranged on a substrate along rows and columns Each string may include a plurality of memory cells stacked in a direction perpendicular to the substrate. Specifically, the memory cells are arrayed on the substrate along rows and columns and are stacked in a direction perpendicular to the substrate, and thereby form a three-dimensional structure. The memory cells can store one or more bits per cell.

The block gating unit 120 can be connected to the memory cell array 110 through string select lines SSL, word lines WL and ground select lines GSL. The block gating unit 120 can be connected to the address decoder 130 through sting lines SS, select lines S and ground lines GS. The block gating unit 120 can receive a block select signal BSS from the address decoder 130.

The block gating unit 120 can select a memory block of the memory cell array 110 in response to the block select signal BSS. The block gating unit 120 can electrically connect string select lines SSL, word lines WL and a ground select line or ground select lines GSL of a selected memory block to string lines SS, select lines S and ground lines GS.

The address decoder 130 can be connected to the block gating unit 120 through string lines SS, select lines S and ground lines GS. The address decoder 130 can operate under the control of the control logic 150. The address decoder 130 can receive an address ADDR from the outside.

The address decoder 130 can decode row addresses among received addresses ADDR. The address decoder 130 can output the block select signal BSS on the basis of a decoded block address among decoded row addresses. The address decoder 130 can select a select line corresponding to the decoded row address among the select lines S. The address decoder 130 can select a string line and a ground line corresponding to the decoded row address among the ground lines GS.

The address decoder 130 can decode a column address among the received addresses ADDR. The address decoder 130 can transmit the decoded column address DCA to the read & write circuit 140.

The address decoder 130 may include a row decoder decoding a row address, a column decoder decoding a column address and an address buffer storing a received address ADDR.

The read & write circuit 140 can be connected to the memory cell array 110 through bit lines BL. The read & write circuit 140 can exchange data with the outside. The read & write circuit 140 can under the control of the control logic 150. The read & write circuit 140 can receive a decoded column address DCA from the address decoder 130. In response to the decoded column address DCA, the read & write circuit 140 can select bit lines BL.

For example, the read & write circuit 140 can receive data DATA from the outside and can write the received data in the memory cell array 110. The read & write circuit 140 can read data DATA from the memory cell array 110 and can output the read data. The read & write circuit 140 can read data from a first storage area of the memory cell array 110 and can write the read data in a second storage area of the memory cell array 110. That is, the read & write circuit 140 can perform a copy-back operation.

The read & write circuit 140 may include constituent elements such as a page buffer (or a page register), a column select circuit, a data buffer, etc. The read & write circuit 140 may also include constituent elements such as a sense amplifier, a write driver, a column select circuit, a data buffer, etc.

The control logic 150 can be connected to the address decoder 130 and the read & write circuit 140. The control logic 150 can control an overall operation of the nonvolatile memory device 100.

Figure 2:
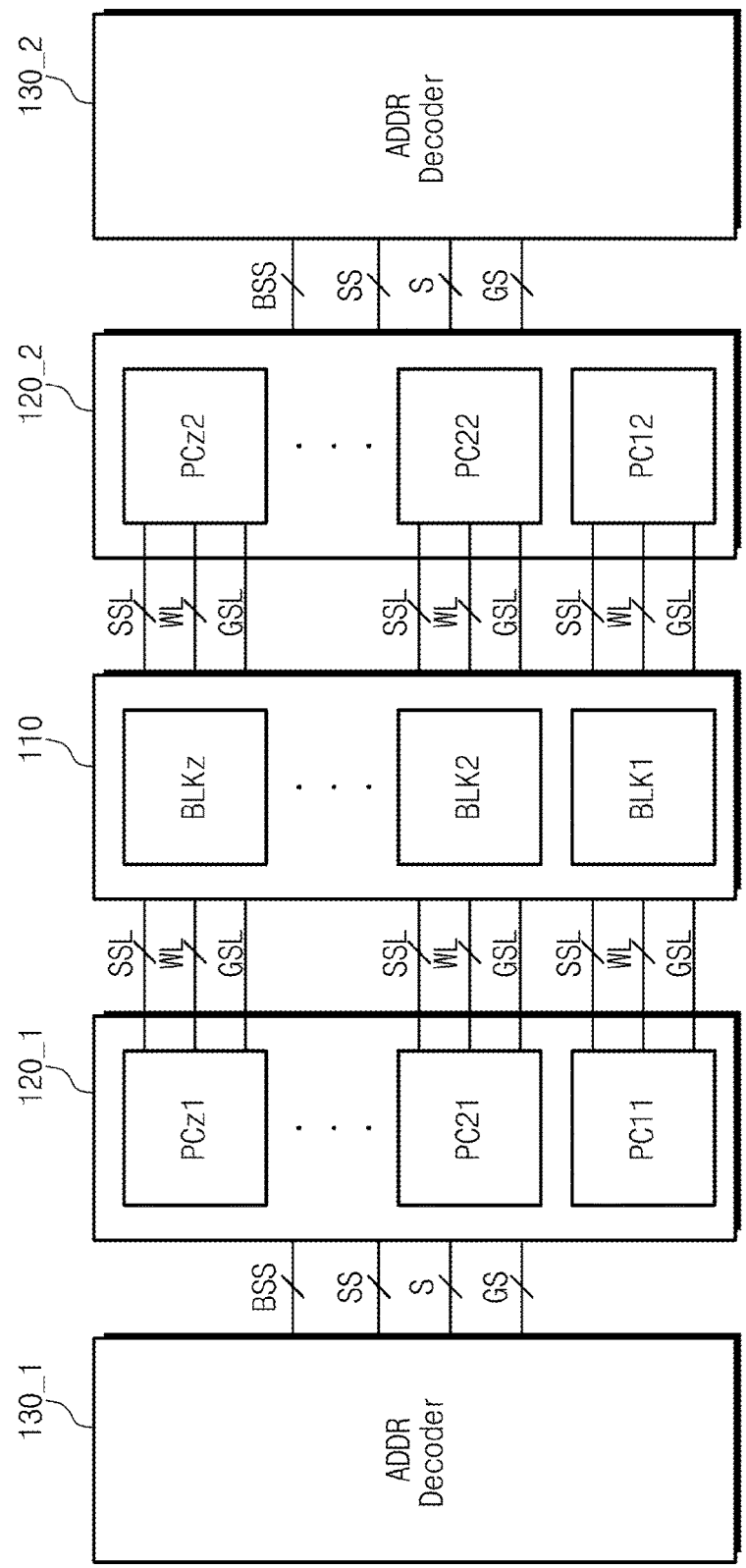
FIG. 2 is a block diagram of components of the nonvolatile memory device illustrated in FIG. 1.

FIG. 2 shows a plurality of memory blocks BLK1~BLKz of the memory cell array 110. Each memory block is connected to the block gating unit through a plurality of string select lines SSL, a plurality of word lines WL and one or a plurality of ground select lines GSL. The block gating unit may be disposed at both sides of the memory cell array 110. For example, odd numbered word lines may be connected to a first subdivision 120_1 of the block gating unit. The first subdivision 120_1 of the block gating unit may be connected to a first subdivision 130_1 of the address decoder. The even numbered word lines may be connected to a second subdivision 120_2 of the block gating unit. The second subdivision of the 120_1 block gating unit may be connected to a second subdivision of the 130_2 address decoder. For convenience, the first subdivision 120_1 of the block gating unit will be referred to hereinafter as the first gating unit 120_1, the second subdivision 120_2 of the block gating unit will be referred to hereinafter as the second gating unit 120_2, etc.

The first gating unit 120_1 may include a plurality of pass circuits PC11~PCz1. The pass circuits PC11~PCz1 can correspond to the memory blocks BLK1~BLKz, respectively. The second gating unit 120_2 may include a plurality of pass circuits PC12~PCz2. The pass circuits PC12~PCz2 can also correspond to the memory blocks BLK1~BLKz, respectively. That is, for example, the pass circuits PC11 and PC12 are operatively associated with the first memory block BLK1, the pass circuits PC21 and PC22 operatively associated with the second memory block BLK2 . . . and the pass circuits PCz1 and PCz2 operatively associated with the zth memory block BLKz.

A pass circuit operatively can electrically connect string select lines SSL, word lines WL and ground select lines GSL of its corresponding memory block to string lines SS, select lines S and ground lines GS.

Figure 3:
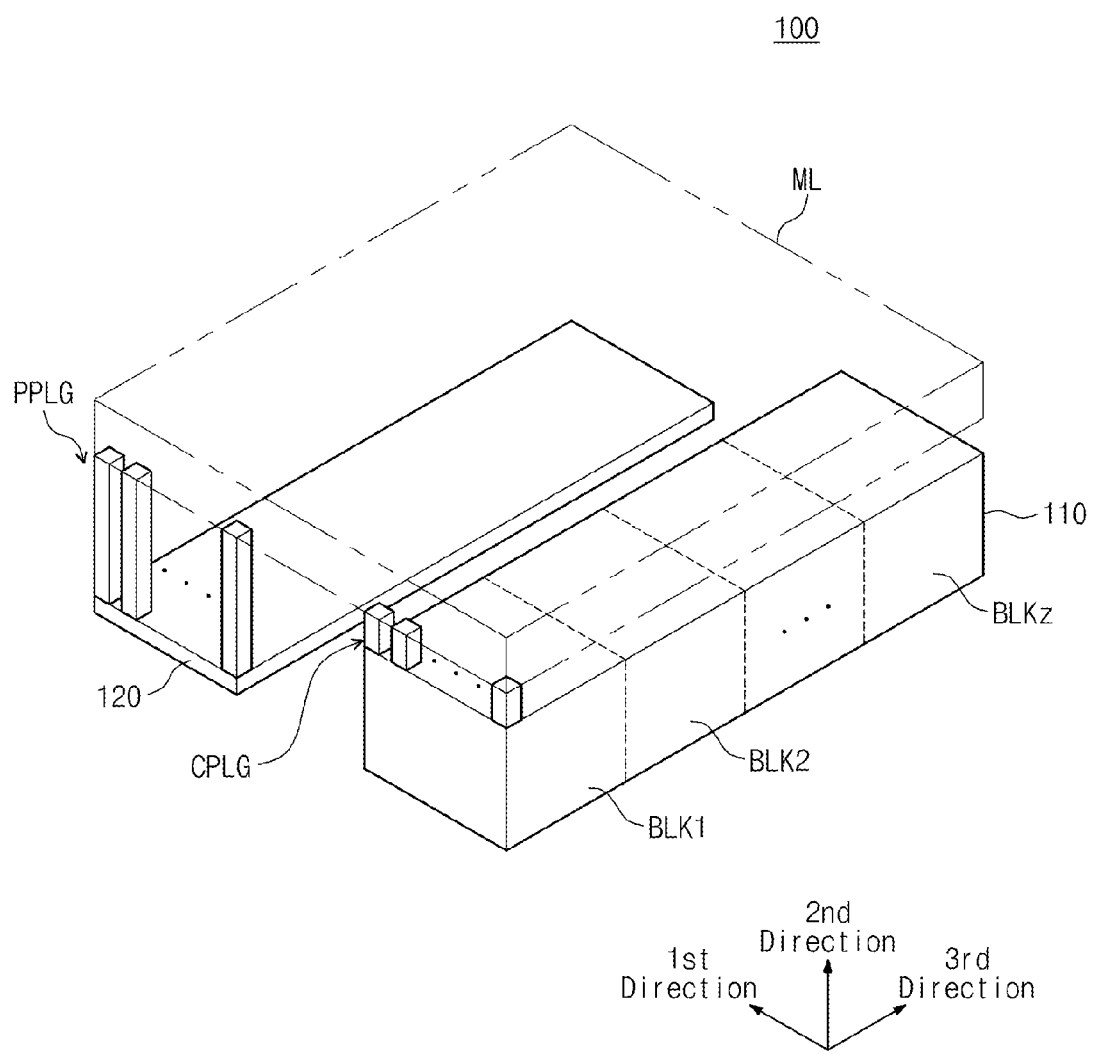
FIG. 3 is a perspective view of a memory cell array and a block gating unit of the device illustrated in FIG. 1.

FIG. 3 shows the stacked structure of the memory blocks BLK1~BLKz.

With further reference to FIG. 3, the block gating unit 120 may have a planar structure. In particular, the block gating unit 120 may be formed on a plane extending along the first and third directions.

The memory cell array 110 and the block gating unit 120 can be connected to each other through a metal layer ML including at least one layer of metal wiring. The metal layer ML can be formed on and span the memory cell array 110 and the block gating unit 120. The memory cell array 110 can be connected to wiring of the metal layer ML through cell plugs CPLG. The block gating unit 120 can be connected to the wiring of the metal layer ML through peripheral plugs PPLG.

In FIG. 3, the cell plugs CPLG and the peripheral plugs PPLG are illustrated atop ends of the memory cell array 110 and the block gating unit 120 respectively. However, the cell plugs CPLG and the peripheral plugs PPLG may be provided atop any part of the memory cell array 110 and the block gating unit 120.

Figure 4:
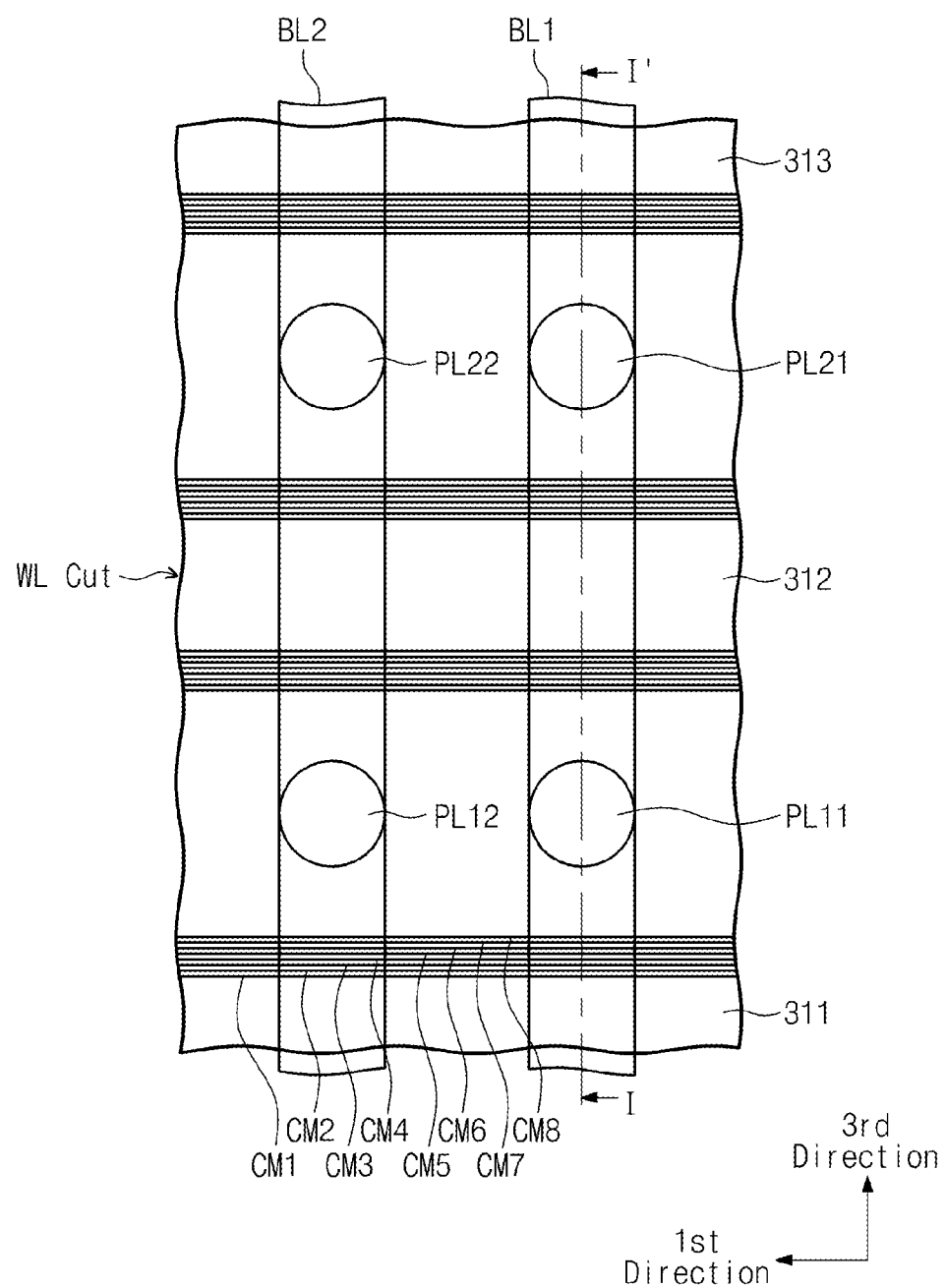
FIG. 4 is a plan view of part of one of the memory blocks BLKa of the memory cell array illustrated in FIGS. 2 and 3.
Figure 5:
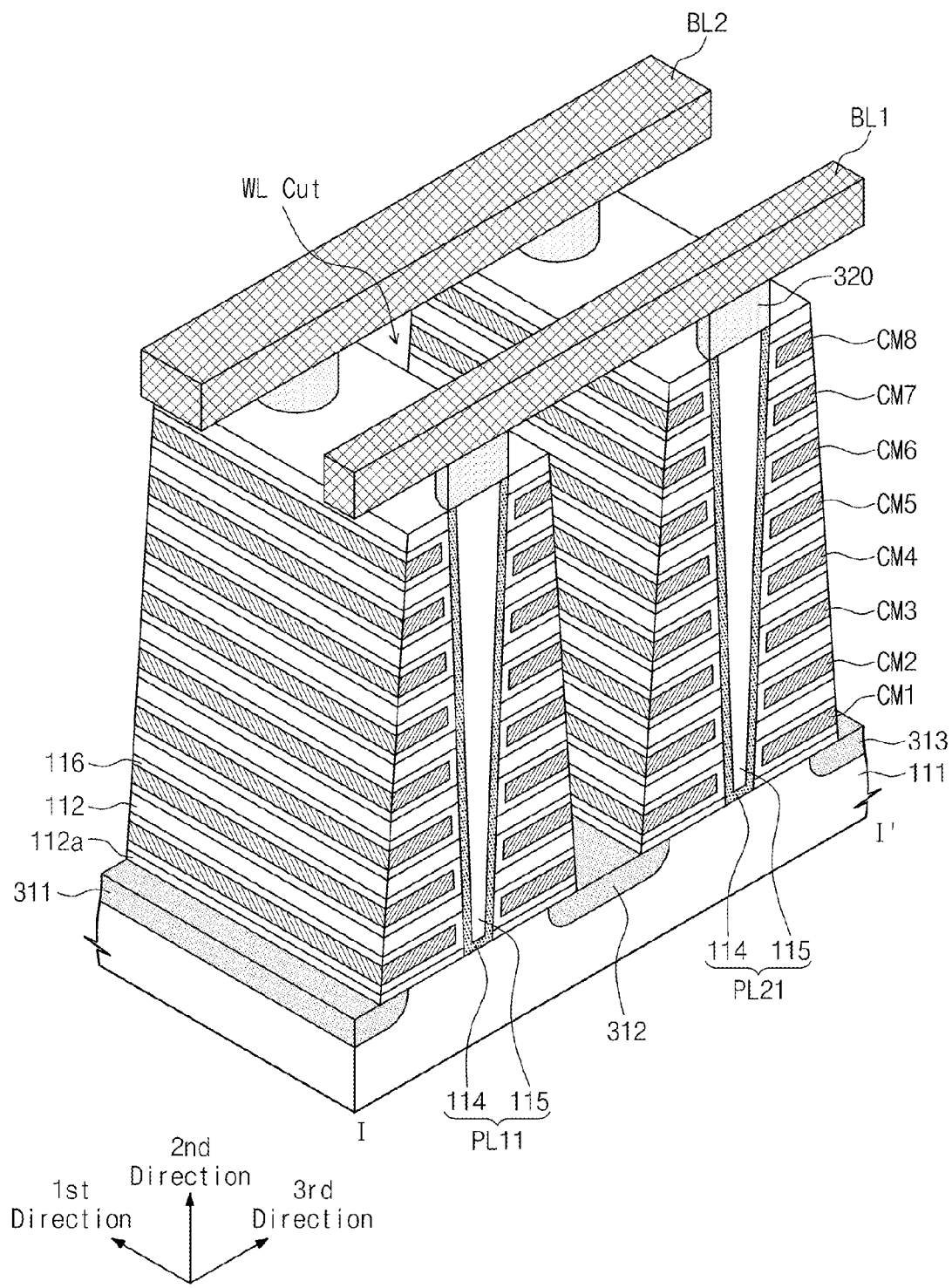
FIG. 5 is a cross-sectional view, in perspective, of the memory block BLKa taken along line I-I' of FIG. 4.
Figure 6:
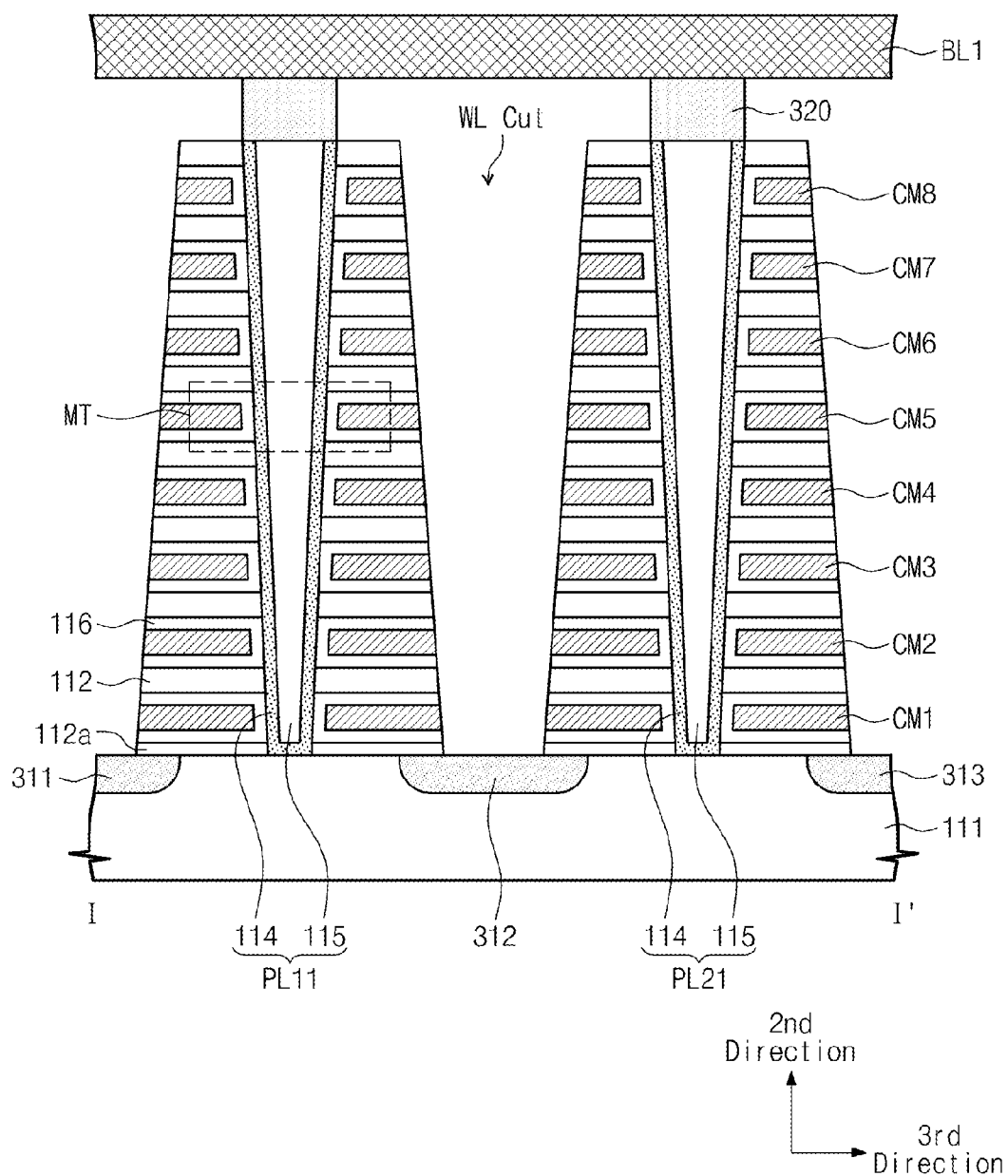
FIG. 6 is a cross-sectional view taken along line I-I' of FIG. 4.

FIGS. 4, 5 and 6 illustrate a representative one of the memory blocks, designated by reference BLKa.

A substrate 111 is provided. The substrate may comprise a well having a first conductivity type. For example, the substrate 111 may comprise a bulk substrate and a P well 111 formed by injecting a group-III element like boron B into an upper portion of the bulk substrate. The P well may be provided inside an N well. For purposes of description, the present embodiment will be described as including a substrate having a P well (or a pocket P well) atop which a stacked structure is formed. However, the conductivity type of the region (e.g., well) of the substrate on which the stacked structure is formed is not limited to a P conductivity type.

Doping regions extending in the first direction are provided in the substrate. The doping regions are spaced a specific distance apart from each other along the third direction. The doping regions may include a first doping region 311, a second doping region 312 and a third doping region 313.

The first through third doping regions 311-313 have a second conductivity type different from the substrate 111. In this example, therefore, the first through third doping regions 311-313 have an N conductivity type.

Insulators 112 and 112a (which in the alternative may be referred to hereinafter as insulating layers 112 and 112a) are stacked on the substrate 111, i.e., in the second direction perpendicular to the substrate. The insulators 112 and 112a are spaced from one another along the second direction. The insulators 112 and 112a extend in the first direction between adjacent ones of the doping regions 311-313. The insulators 112 and 112a each comprise a layer of electrically insulating material such as a silicon oxide layer. The insulator 112a which is in contact with the substrate 111 may be thinner than the other insulators 112.

Pillars PL11, PL12, PS21 and PL22 are provided between adjacent ones of the first through third doping regions 311~313. The pillars PL11, PL12, PS21 and PL22 extend through the insulators 112 and 112a in the second direction, and can contact the substrate 111. Each of the pillars PL11, PL12, PS21 and PL22 can be a multi-layered structure. For example, each of the pillars PL11, PL12, PS21 and PL22 may include a channel layer 114 and internal material 115 surrounded by the channel layer 114.

The channel layer 114 may include a semiconductor material (e.g., silicon) having the first conductivity type, i.e., the same conductivity type as the substrate 111. For example, the channel layer 114 may include silicon. In an example of this embodiment, the channel layers 114 are layers of silicon doped to have a P type of conductivity. Alternatively, the channel layer 114 may comprise a layer of intrinsic semiconductor material not having a particular conductivity type, e.g., may comprise a layer of undoped silicon.

The internal material 115 includes electrically insulating material. For example, the internal material 115 may include silicon oxide. Alternatively, the internal material 115 may be omitted so that an empty space (air) is left within the channel layer 114. In either case, therefore, the medium within the channel layer 114 is electrically insulating.

Information storage layers 116 are also provided between adjacent ones of the first through third doping regions 311~313. The information storage layers 116 extend along and contact surfaces of the insulating layers 112 and 112a and the pillars PL11, PL12, PS21 and PL22. The thickness of the information storage layers 116 may be smaller than the distance between adjacent ones of the insulating layers 112 and 112a in the second direction.

Conductors CM1~CM8 (which in the alternative may be referred to hereinafter as conductive layers CM1~CM8) are also provided between ones of the first through third doping regions 311~313. The conductors CM1~CM8 are of electrically conductive material and may each comprise a metallic layer. The conductive layers Alternatively, the conductors CM1~CM8 may each include a nonmetallic electrically conductive material such as doped polysilicon.

The conductors CM1~CM8 extend along and contact surfaces of the information storage layers 116. Specifically, for example, each of the conductors CM1~CM8 extends in the first direction between and contacts a segment of an information storage layer 116 disposed on the bottom surface of an upper one of the insulating layers and a segment of the information storage layer 116 provided on a top surface of a lower one of the insulating layers.

Drains 320 may be provided on the pillars PL11, PL12, PL21 and PL22, respectively. In particular, the drains 320 may extend on the channel layers 114 of the pillars PL11, PL12, PL21 and PL22. The drains 320 may include a semiconductor material (e.g., silicon) doped so as to have a particular conductivity type. In the example of this embodiment, the drains 320 are of silicon doped so as to have an N conductivity type.

Bit lines BL1 and BL2 that extend in the third direction, and are spaced a , apart from one another in the first direction, are provided on the drains 320. The bit lines BL1 and BL2 are electrically connected to the drains 320. The drains 320 can be connected to the bit lines BL1 and BL2 through contact plugs (not shown). The bit lines BL1 and BL2 are of electrically conductive material, i.e., are of metallic material or nonmetallic conductive material such as doped polysilicon.

The pillars PL11, PL12, PS21 and PL22 can be arrayed in the first and second directions such that rows and columns of the pillars PL11, PL12, PL21 and PL22 of the memory block BLKa are defined.

In this respect, the conductive layers CM1~CM8 and the insulating layers 112 and 112a may be divided by a word line cut WL cut. The word line cut WL may be aligned with the second doping region 312 as the center, and divides the pillars into rows.

In the illustrated example, the pillars PL11 and PL12 connected by the conductive layers CM1~CM8 and the information storage layers 116, which are disposed between the first doping region 311 and the second doping region 312, constitute a first row of the pillars. The pillars PL21 and PL22 connected by the conductive layers CM1~CM8 and the information storage layers 116, which are disposed between the second doping region 312 and the third doping region 313, constitute a second row of the pillars.

Columns of the pillars PL11, PL12, PL21 and PL22 are defined according to the bit lines BL1 and BL2. In the illustrated example, the pillars PL11 and PL21 connected to each other through the first bit line BL1 and respective drains 320 constitute a first column of the pillars. The pillars PL12 and PL22 connected to each other through the second bit line BL2 and the drain 320 constitute a second column of the pillars.

Each of the pillars PL11, PL12, PL21 and PL22 forms a cell string together with adjacent information storage layers 116 and adjacent conductive layers CM1~CM8. Thus, the pillars PL11, PL12, PL21 and PL22 form a plurality of cell strings together with information storage layers 116 and conductive layers CM1~CM8. Each cell string includes a plurality of cell transistors MT stacked in a direction perpendicular to the substrate 111.

Figure 7:
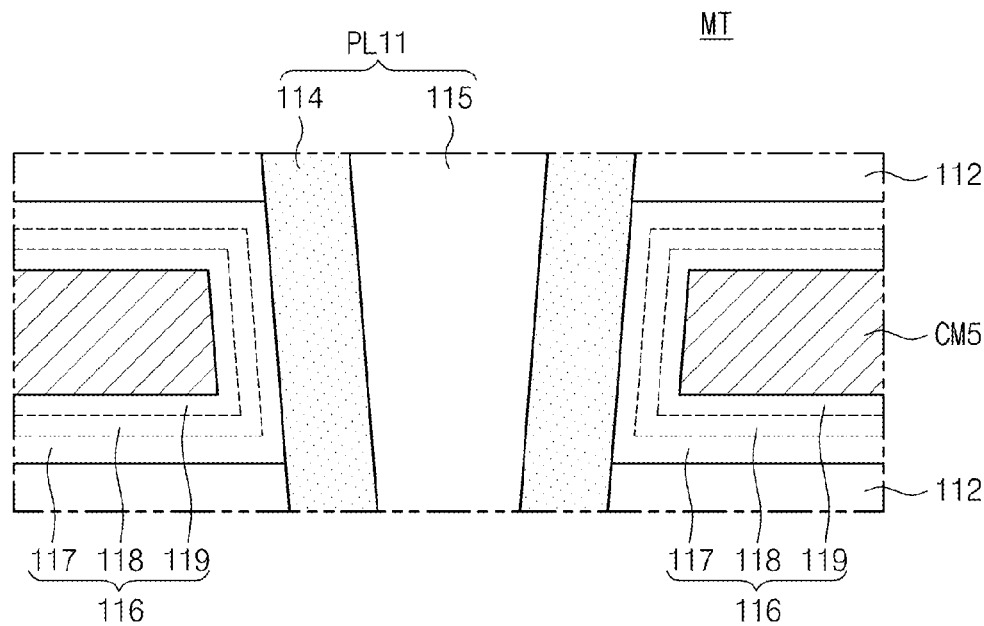
FIG. 7 is an enlarged view of one of the cell transistors MT illustrated in FIG. 6.

FIG. 7 illustrates an exemplary one of the cell transistors MT and in particular, the cell transistor MT shown in FIG. 6 within the dashed line. This cell transistor is disposed at the fifth level, among the levels of cell transistors MT, and comprises the pillar PL11 that makes up both the first row and first column of the pillars.

Referring to FIGS. 4 through 7, the cell transistor MT includes the fifth conductive layer CM5, a part of the pillar PL11 adjacent to the fifth conductive layer CM5 and the information storage layer 116 interposed between the fifth conductive layer CM5 and the pillar PL11. The information storage layer 116 in this example includes first through third insulating sub-layers 117, 118 and 119.

In the cell transistors MT, and as mentioned above, the channel layers 114 of the pillars PL11, PL12, PL21 and PL22 may include p-type silicon similarly to the substrate 111. The channel layers 114 operate as a body of the cell transistor MT. The channel layers 114 are vertical channel layers 114 in that extend in a direction perpendicular to the substrate 111. Thus, each of the channel layers 114 of the pillars PL11, PL12, PL21 and PL22 acts a vertical body of the memory transistors MT of a cell string. Channels formed in each of the channel layers 114 of the pillars PL11, PL12, PL21 and PL22 form vertical channels of the memory transistors MT of the cell string.

The first insulating sub-layers 117 adjacent to the pillars PL11, PL12, PL21 and PL22 operate as tunneling insulating layers. To this end, the first insulating sub-layers 117 may comprise thermal oxide layers. For example, each first insulating sub-layer 117 may include a silicon oxide layer.

Second insulating sub-layers 118 operate as charge storage layers. For example, the second insulating sub-layers 118 can operate as charge capturing layers. For example, the second insulating sub-layers 118 may each comprise a nitride layer or a metallic oxide layer (e.g., an aluminum oxide layer, a hafnium oxide layer, or the like). In this example, each of the second insulating sub-layers 118 is a silicon nitride layer.

Third insulating sub-layers 119 adjacent to the conductive layers CM1~CM8 operate as blocking insulating layers. The third insulating sub-layers 119 may each consist of a single layer or a laminate (multiple layers). The third insulating sub-layers 119 may each be a dielectric layer (e.g., an aluminum oxide layer, a hafnium oxide layer, or the like) having a dielectric constant higher than each of those of the first and second insulating sub-layers 117 and 118. The first through third insulating sub-layers 117-119 may constitute an ONO (oxide-nitride-oxide) structure.

The conductive layers CM1~CM8 operate as gates (or control gates).

Therefore, in this example, the conductive layers CM1~CM8 operating as gates (or control gates), the third insulating sub-layers 119 operating as blocking insulating layers, the second insulating sub-layers 118 operating as charge capturing layers, the first insulating sub-layers 117 operating as tunneling insulating layers and the channel layers 114 operating as a vertical body constitute the cell transistors MT.

Respective ones of the cell transistors MT may be charge capturing transistors. However, others of the cell transistors MT may be used for different purposes. For example, among the cell transistors MT, at least one cell transistor at an upper portion of each cell string may be used as a string select transistor SST, at least one cell transistor at a lower portion of the cell string may be used as a ground select transistor GST, and the remaining cell transistors may be memory cell transistors and may include at least one dummy memory cell transistor. In this respect, the conductive layers CM1~CM8 also serve as conductive lines connecting the cell transistors MT of the same row to one another. Therefore, each conductive layer CM1~CM8 may constitute a string select line SSL, a ground select line GSL, a word line WL, or a dummy word line DWL, depending on their level in the cell string.

Figure 8:
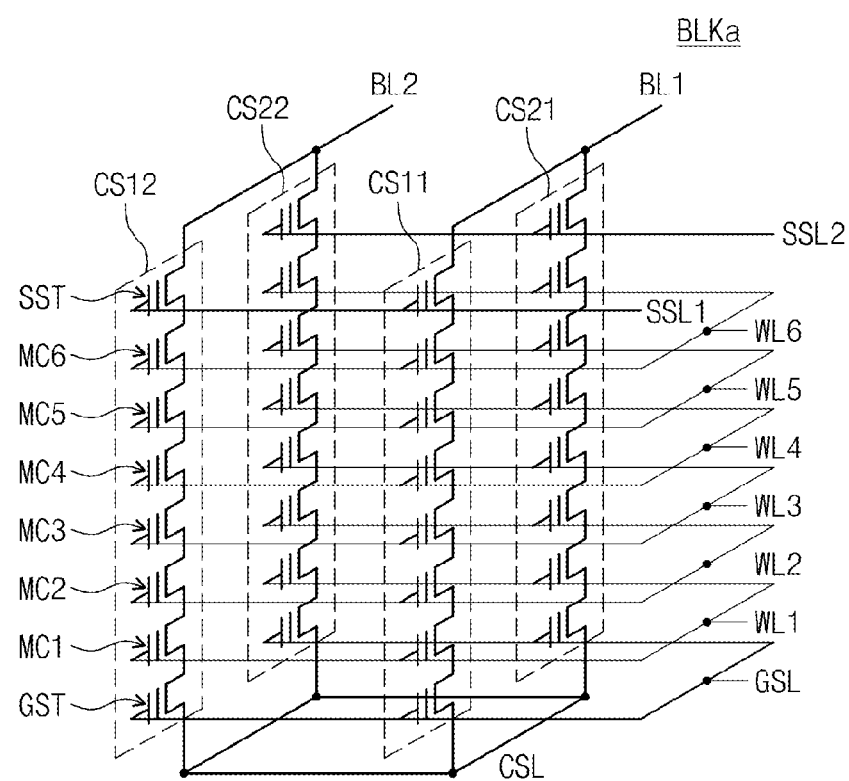
FIG. 8 is an equivalent circuit diagram of memory blocks BLKa of a nonvolatile memory device in accordance with the inventive concept.

FIG. 8 shows an example of an equivalent circuit of the memory blocks BLK.

In this examples shown in FIGS. 4 through 8, cell strings CS11 and CS21 are provided between the first bit line BL1 and a common source line CSL. Cell strings CS12 and CS22 are provided between the second bit line BL2 and the common source line CSL. The cell strings CS11, CS21, CS12 and CS22 comprise the pillars PL11, PL21, P12 and P22, respectively.

More specifically, in this example, the pillar PL11 of a first row and a first column constitutes the string CS11 of a first row and a first column together with the conductive layers CM1~CM8 and the information storage layers 116. The pillar PL12 of a first row and a second column constitutes the string CS12 of a first row and a second column together with the conductive layers CM1~CM8 and the information storage layers 116. The pillar PL21 of a second row and a first column constitutes the string CS21 of a second row and a first column together with the conductive layers CM 1- and the information storage layers 116. The pillar PL22 of a second row and a second column constitutes the string CS22 of a second row and a second column together with the conductive layers CM1~CM8 and the information storage layers 116.

In the cell strings CS11, CS21, CS12 and CS22, the first (lower) level of cell transistors operate as ground select transistors GST. Cell strings of the same row share a ground select line GSL. Cell strings of different rows also share the ground select line GSL. To these ends, the first conductive layers CM1 are connected to one another to form the ground select line GSL.

In the cell strings CS11, CS21, CS12 and CS22, cell transistors at the second through seventh levels operate as first through sixth memory cells MC1~MC6. The first through sixth memory cells MC1~MC6 are connected to first through sixth word lines WL1~WL6, respectively. Memory cells at the same level and disposed in the same row share a word line. Memory cells at the same level and disposed in different rows also share the word line. That is, all the memory cells MC located at the same level in the memory block BLKa share a word line.

The second conductive layers CM2 are connected to form the first common word line WL1. The third conductive layers CM3 are connected to form the second common word line WL2. The fourth conductive layers CM4 are connected to form the third common word line WL3. The fifth conductive layers CM5 are connected to form the fourth word common line WL4. The sixth conductive layers CM6 are connected to form the fifth common word line WL5. The seventh conductive layers CM7 are connected to form the sixth common word line WL6.

In the cell strings CS11, CS21, CS12 and CS22, cell transistors disposed at the eighth level operate as string select transistors SST. The string select transistors SST are connected to first and second string select lines SSL1 and SSL2. Cell strings in the same row share a string select line. Cell strings in the different rows are connected to different string select lines. The first and second string select lines SSL1 and SSL2 are provided by the eighth conductive layers CM8. Thus, rows of the cell strings CS11, CS21, CS12 and CS22 may be defined by the first and second string select lines SSL1 and SSL2, respectively.

The common source line CSL is connected to the cell strings CS11, CS21, CS12 and CS22. For example, the first through third doping regions 311-313 may be connected to one another to form the common source line CSL (refer to FIGS. 4 through 6).

As described above, the string select lines SSL1 and SSL2, the word lines WL1~WL6 and the ground select line GSL of the selected memory block are connected to the address decoder 130 through the pass circuits of the block gating unit 120. The address decoder 130 selects the string select lines SSL1 and SSL2, the word lines WL1~WL6 and the ground select line GSL of the selected memory block.

Memory cells disposed at the same level are connected to one word line, i.e., a common word line. Thus, when a word line at a specific level is selected, all the cell strings CS11, CS12, CS21 and CS22 connected to the selected word line are selected.

Different rows of cell strings are connected to different select lines, respectively. In this example, therefore, rows of the cell strings (CS11 and CS12, or CS21 and CS22) can be selected or unselected by selecting or unselecting the first and second string select lines SSL1 and SSL2. Thus, by selecting one of the first and second string select lines SSL1 and SSL2 and unselecting the other of the string select lines SSL1 and SSL2, the unselected row of cell strings CS11 and CS12, or CS21 are electrically disconnected from the bit lines BL1 and BL2, whereas the selected row of cell strings (e.g., CS21 and CS22, or CS11 and CS12) are electrically connected to the bit lines BL1 and BL2. A respective cell string in the selected row can be selected by selecting one the bit lines BL1 and BL2. That is, the columns of cells strings can be selected and unselected by selecting and unselecting the bit lines BL1 and BL2.

In the embodiment of the memory block BLKa shown in and described above with reference to FIGS. 4 through 8, the memory block BLKa has eight levels (of cell transistors) and includes two rows and two columns of cell strings.

However, i.e., in another embodiment, the number of levels of the memory block BLKa corresponds to the number of the cell strings. For example, the memory blocks BLKa may have eight levels, and eight rows and columns of cell strings. In this example, eight string select lines and one ground select line may be connected to the memory blocks BLKa. In another example, the memory block BLKa has sixteen levels, and sixteen rows and columns of cell strings. In this example, sixteen string select lines and one ground select line may be connected to the memory blocks BLKa. Thus, in these examples, the memory block BLKa is characterized by cell strings each having n levels of cell transistors, n rows of the cells stings, n columns of the cell strings, n string select lines and one ground select line.

Figure 9:
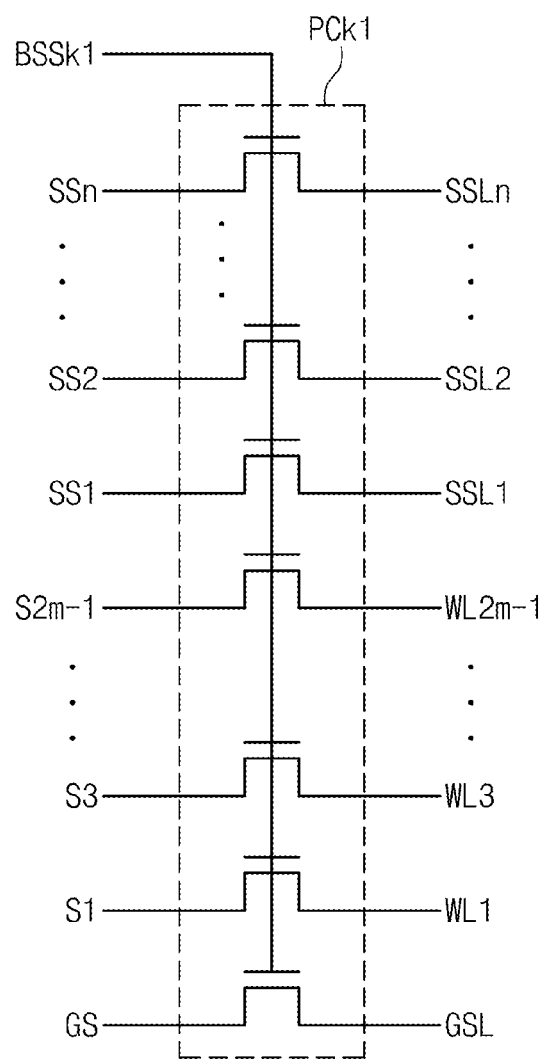
FIG. 9 is a circuit diagram of one of the pass circuits PC11~PCz1 illustrated in FIG. 2.

FIG. 9 illustrates an exemplary one of the pass circuits PC11~PCz1 (FIG. 2) designated in this figure by reference PCk1. Referring to FIG. 9, the pass circuit PCk1 may include a plurality of pass transistors. The pass circuit PCk1 may be connected to odd numbered word lines WL1~WL2m-1 and select lines S1~S2m-1 corresponding to the odd numbered word lines WL1~WL2m-1.

In response to a block select signal BSSk1, the pass transistors can connect string select lines SSL1~SSLn, word lines WL1~WL2m-1, and a ground select line GSL to string lines SS1~SSn, select lines S1~S2m-1 and a ground line GS, respectively. The pass transistors may be high voltage transistors.

An activated block select signal BSSk1 may be supplied to a pass circuit operatively connected to one of the memory blocks BLK1~BLKz. In this case, string select lines SSL1~SSLn, word lines WL1~WL2m-1, and a ground select line GSL of the selected memory block may be connected to the address decoder 130. Although not illustrated in the drawing, a ground voltage VSS may be supplied to unselected string select lines SSL1~SSLn and a ground select line GSL of unselected memory blocks such that word lines WL1~WL2m-1 may be floated. Thus, the unselected memory blocks can be electrically disconnected or isolated from bit lines BL and the common source line CSL.

Figure 10:
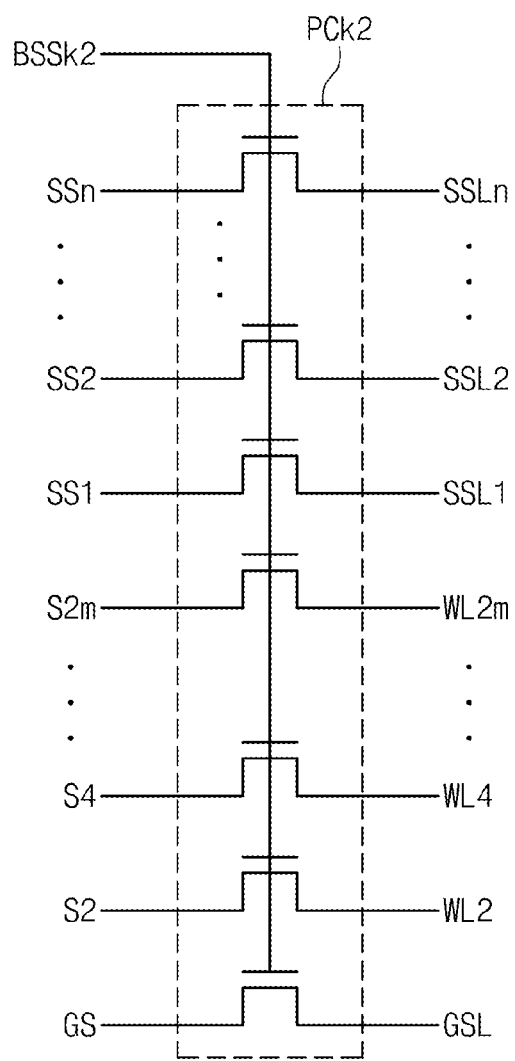
FIG. 10 is a circuit diagram of another of the pass circuits PC12~PCz2 illustrated in FIG. 2.

FIG. 10 is a circuit illustrating an exemplary one of the pass circuits PC12~PCz2 (FIG. 2), designated in this figure by reference PCk2. Referring to FIG. 10, the pass circuit PCk2 may include a plurality of pass transistors. The pass circuit PCk2 may be connected to even numbered word lines WL2~WL2m and select lines S2~S2m corresponding to the even numbered word lines WL2~WL2m.

In response to a block select signal BSSk2, the pass transistors can connect string select lines SSL1~SSLn, word lines WL2~WL2m, and a ground select line GSL to string lines SS1~SSn, select lines S2~S2m and a ground line GS, respectively. The pass transistors may be high voltage transistors.

An activated block select signal BSSk2 may be supplied to a pass circuit operatively connected to one of the memory blocks BLK1~BLKz. In this case, string select lines SSL1~SSLn, word lines WL2~WL2m, and a ground select line GSL of the selected memory block may be connected to the address decoder 130. Although not illustrated in the drawing, a ground voltage VSS may be supplied to unselected string select lines SSL1~SSLn and a ground select line GSL of unselected memory blocks such that word lines WL2~WL2m may be floated. Thus, the unselected memory blocks can be electrically disconnected or isolated from bit lines BL and the common source line CSL.

Figure 11:
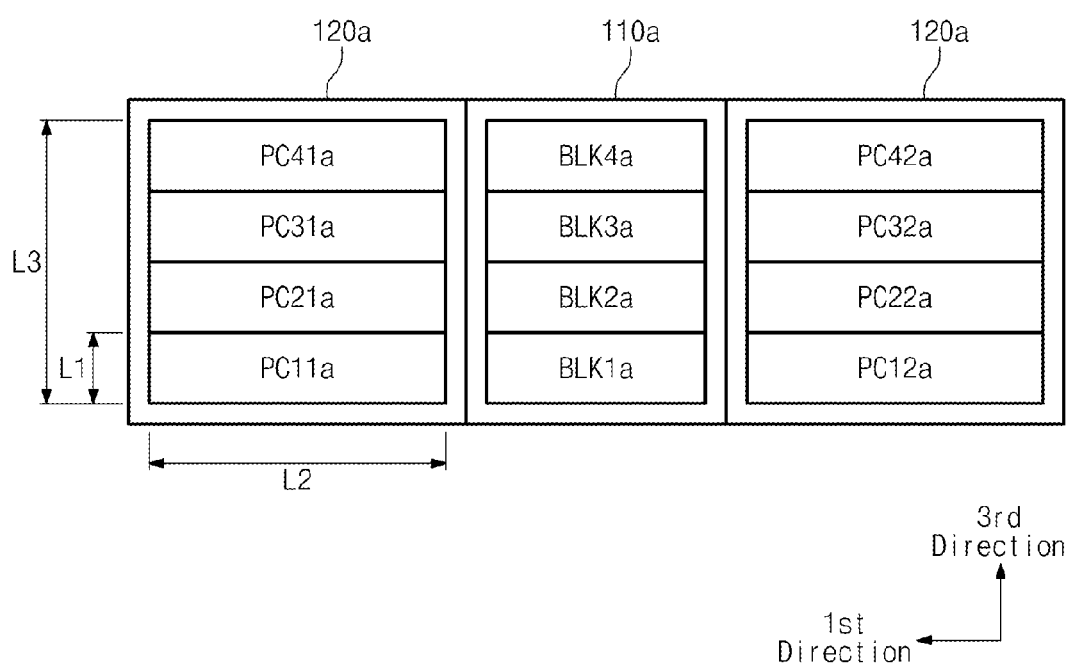
FIG. 11 is a diagram of one embodiment of a layout of the memory cell array and block gating unit that may be employed in the device shown in FIGS. 1 and FIG. 2.
Figure 12:
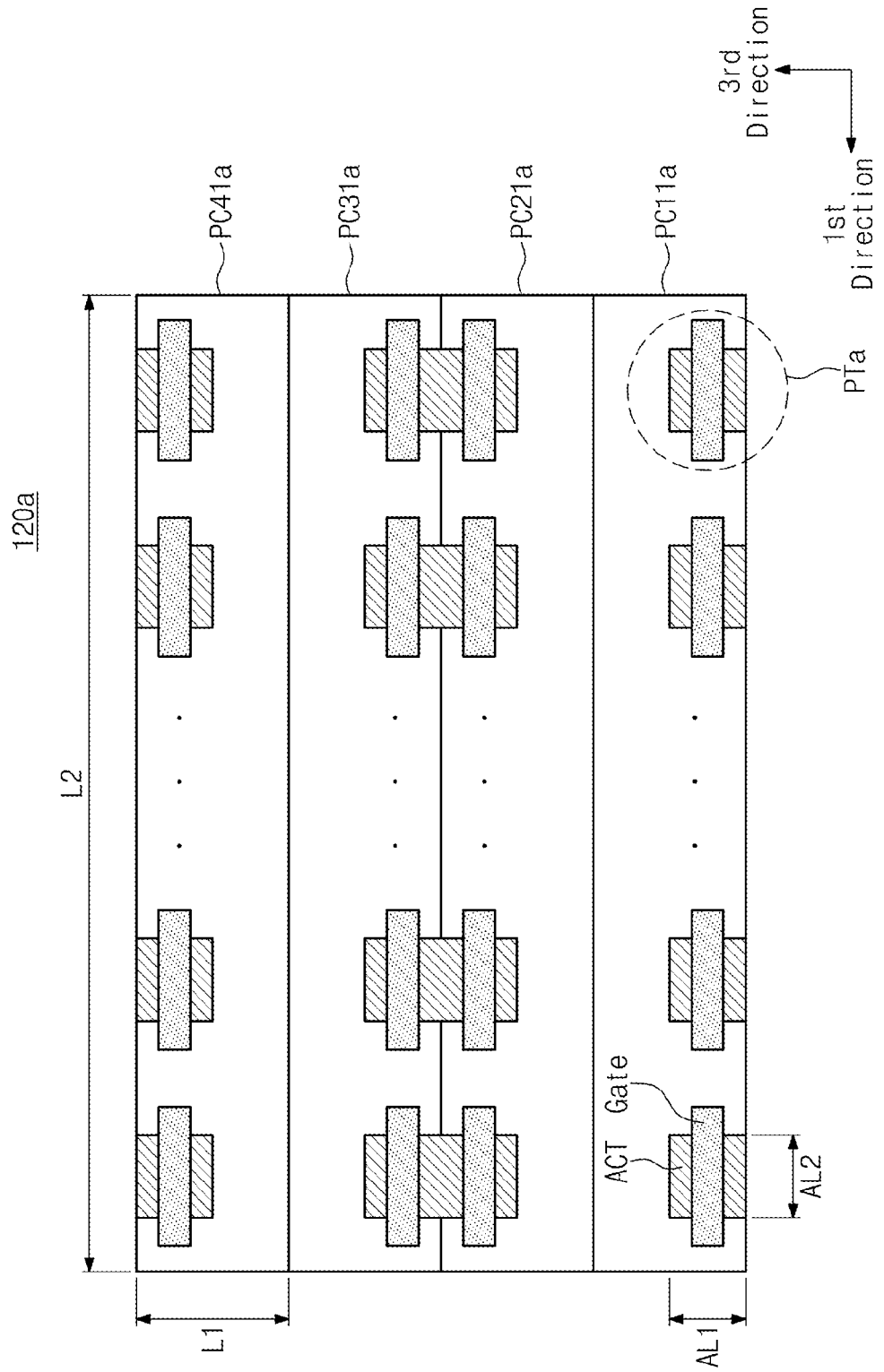
FIG. 12 is a plan view of pass circuits PC11a~PC41a in the layout of FIG. 11.

FIG. 11 illustrates a memory cell array and a block gating unit of FIG. 2. FIG. 12 shows a layout of pass circuits PC11a~PC41a of the block gating unit.

Referring to FIGS. 11 and 12, pass circuits PC11a~PC41a and PC12a~PC41a may be disposed on both sides of a memory cell array 110a. In FIGS. 11 and 12, the memory cell array 110a including four memory blocks BLK1a~BLK4a are shown. However, the memory cell array 110a is not limited thereto. The memory cell array 110a may include more than four memory blocks.

The memory blocks BLK1a~BLK4a may be operatively connected to the pass circuits PC11a~PC41a, respectively and to the pass circuits PC12a~PC42a, respectively. That is, the first memory block BLK1a may be connected to the pass circuits PC11a and PC12a. The second memory block BLK2a may be connected to the pass circuits PC21a and PC22a. The third memory block BLK3a may be connected to the pass circuits PC31a and PC32a. The fourth memory block BLK4a may be connected to the pass circuits PC41a and PC42a. the memory blocks BLK1a~BLK4a can be connected to the pass circuits PC11a~PC41a and PC12a~PC42a using typical interconnection lines in general.

Each of the memory blocks BLK1a~BLK4a has a dimension L1 along the third direction. Each of the pass circuits PC11a~PC41a and PC12a~PC42a may have the same dimension L1 along the third direction. Each of the pass circuits PC11a~PC41a and PC12a~PC42a has a dimension L2 along the first direction. The four memory blocks BLK1a~BLK4a collectively have a dimension L3 along the third direction. The dimension L3 may be four times as long as the dimension L1.

In FIG. 12, pass transistors PTa of each of the pass circuits PC11a~PC41a are arranged in a line along the first direction. Each pass transistor PTa may include an active area ACT and a gate electrode crossing the active area ACT in the first direction. The active area ACT may include a source or a drain of each pass transistor PTa. The active area ACT has a first dimension AL1 in the third direction, and a second dimension AL2 in the first direction.

The pass transistors PTa of different pass circuits may be spaced in the third direction. For example, the pass transistor PTa of the pass circuit PC11a and a pass transistor PTa of the pass circuit PC21a may be aligned but spaced apart by a predetermined distance in the third direction. Otherwise, an error due to a breakdown voltage characteristic may occur.

On the other hand, the adjacent pass transistors PTa in the pass circuits PC21a and PC31a share a source and a drain. Therefore, there is no need to space these adjacent pass transistors PTa apart in the third direction. The pass transistors PTa of the pass circuits PC11a~PC41a can be supplied with the same gate voltage from the address decoder 130 (refer to FIG. 1).

The pass circuits PC12a~PC42a may be similarly arranged.

Figure 13:
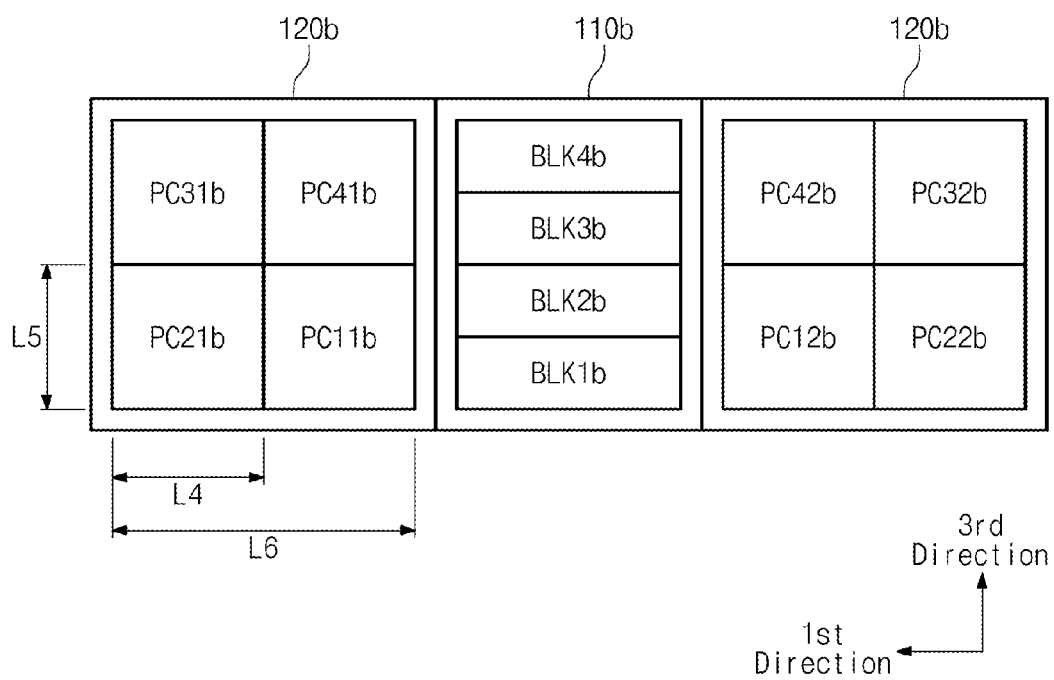
FIG. 13 is a diagram of another embodiment of a layout of the memory cell array and block gating unit that may be employed in the device shown in FIGS. 1 and FIG. 2.
Figure 14:
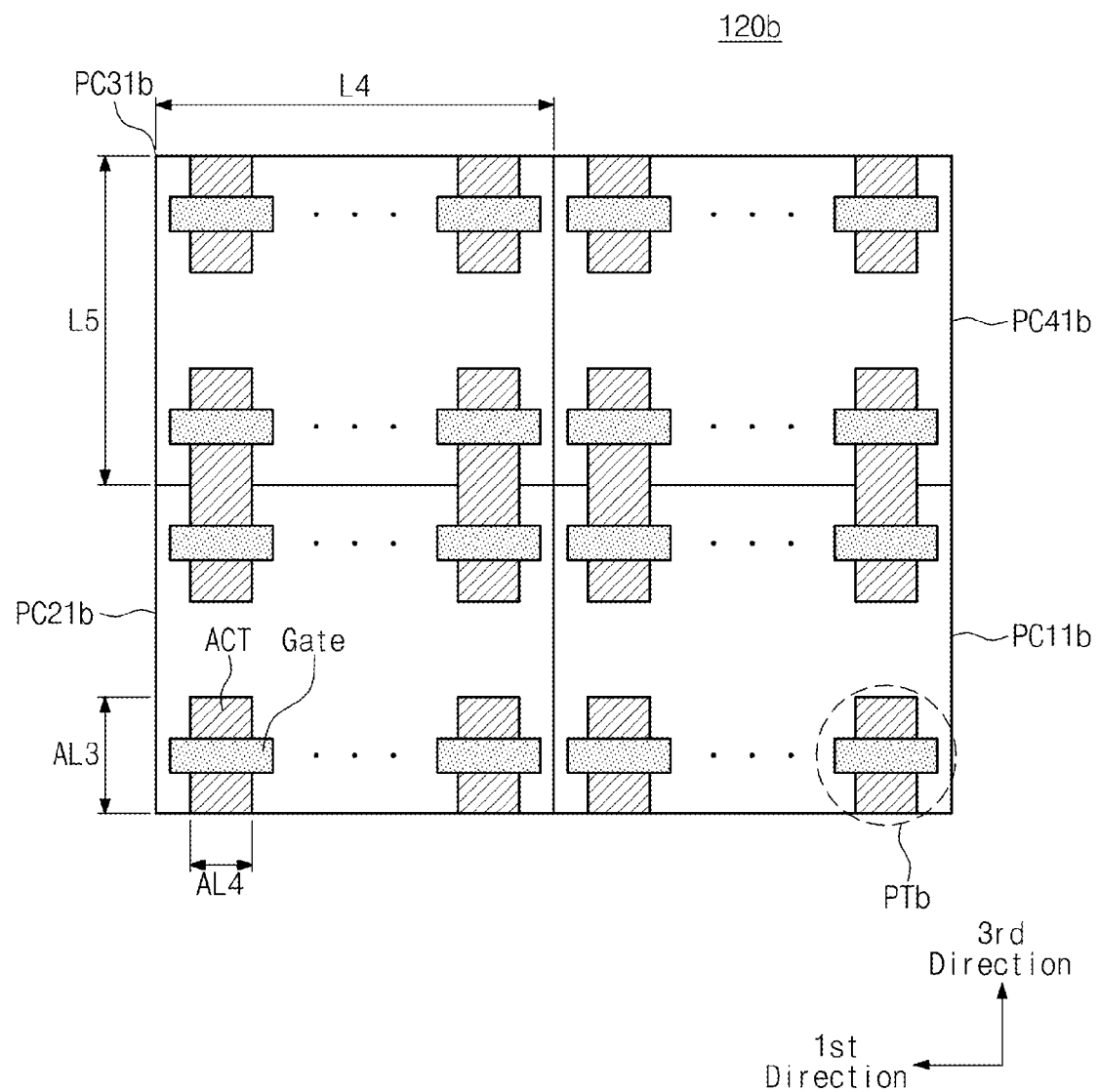
FIG. 14 is a plan view of pass circuits PC11b~PC41b in the layout of FIG. 13.

FIG. 13 illustrates another embodiment of a memory cell array and a block gating unit of FIG. 2. FIG. 14 illustrates the layout of the pass circuits PC11b~PC41b of the block gating unit of FIG. 13 in detail.

Referring to FIGS. 13 and 14, pass circuits PC11b~PC41b and PC12b~PC42b may be disposed at both sides of the memory cell array 110b. In FIGS. 13 and 14, the memory cell array 110b includes four memory blocks BLK1b~BLK4b but the memory cell array 110b is not limited thereto. The memory cell array 110b may include more than four memory blocks.

The memory blocks BLK1b~BLK4b are operatively connected to the pass circuits PC11b~PC41b, respectively, and to the pass circuits PC12b~PC42b, respectively. That is, the first memory block BLK1b may be connected to the pass circuits PC11b and PC12b. The second memory block BLK2b may be connected to the pass circuits PC21b and PC22b. The third memory block BLK3b may be connected to the pass circuits PC31b and PC32b. The fourth memory block BLK4b may be connected to the pass circuits PC41b and PC42b. The memory blocks BLK1b~BLK4b can be connected to the pass circuits PC11b~PC41b and PC12b~PC42b using typical interconnection lines in general.

Each of the memory blocks BLK1b~BLK4b has a dimension L1 along the third direction like the memory blocks BLK1a~BLK4a of FIG. 11. Each of the pass circuits PC11b~PC41b and PC12b~PC42b has a dimension L5 along the third direction. The dimension L5 may be twice as long as the dimension L1.

Each of the pass circuits PC11b~PC41b and PC12b~PC42b has a dimension L4 along the first direction. Each group of pass circuits PC11b~PC41b and PC12b~PC42b collectively have a dimension L6 in the first direction. Twice the dimension L4 may equal the dimension L6.

The pass circuit PC11b may be arranged between the pass circuit PC21b and the memory cell array 110b. The pass circuit PC41b may be arranged between the pass circuit PC31b and the memory cell array 110b. The pass circuit PC12b may be arranged between the pass circuit PC22b and the memory cell array 110b. The pass circuit PC42b may be arranged between the pass circuit PC32b and the memory cell array 110b.

As shown in FIG. 14, the pass transistors PTb of each of the pass circuits PC11b~PC41b may be arranged in two rows along the first direction. Each pass transistor PTb may include an active area ACT and a gate electrode crossing the active area ACT in the first direction. The active area ACT may include a source or a drain of each pass transistor PTb. The active area ACT may have a dimension AL3 along the third direction, and a fourth dimension AL4 along the first direction.

As shown in FIG. 14, the pass transistors PTb may be arranged in two rows in the same pass circuit. Thus, the pass transistors PTb adjacent to one another in the third direction may belong to the same pass circuit. To prevent an error due to a breakdown voltage characteristic, the distance between the pass transistors operatively connected to the same memory block may be smaller than the distance between the pass transistors operatively connected to different memory blocks.

The adjacent pass transistors PTb of the pass circuits PC11b and PC41b or the adjacent pass circuits PC21b and PC31b share a source and a drain. Therefore, there is no need to space these pass transistors PTb along the third direction. The pass transistors PTb of the pass circuits PC11b~PC41b can be supplied with the same gate voltage from the address decoder 130 (refer to FIG. 1).

The pass circuits PC12b~PC42b may be similarly arranged.

Figure 15:
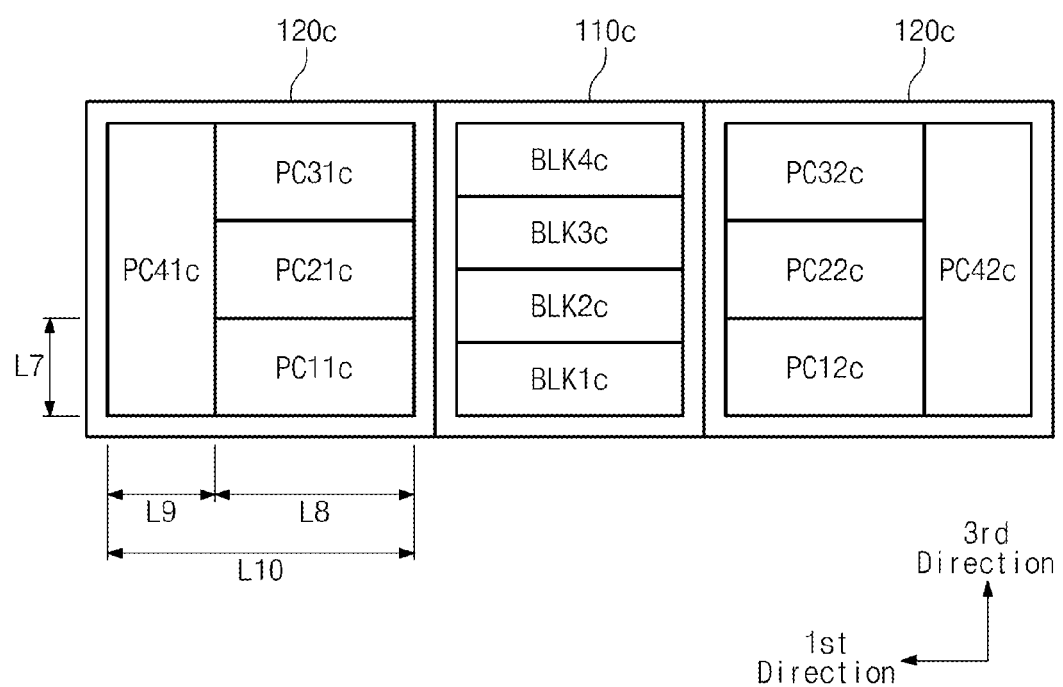
FIG. 15 is a diagram of another embodiment of a layout of the memory cell array and block gating unit that may be employed in the device shown in FIGS. 1 and FIG. 2.
Figure 16:
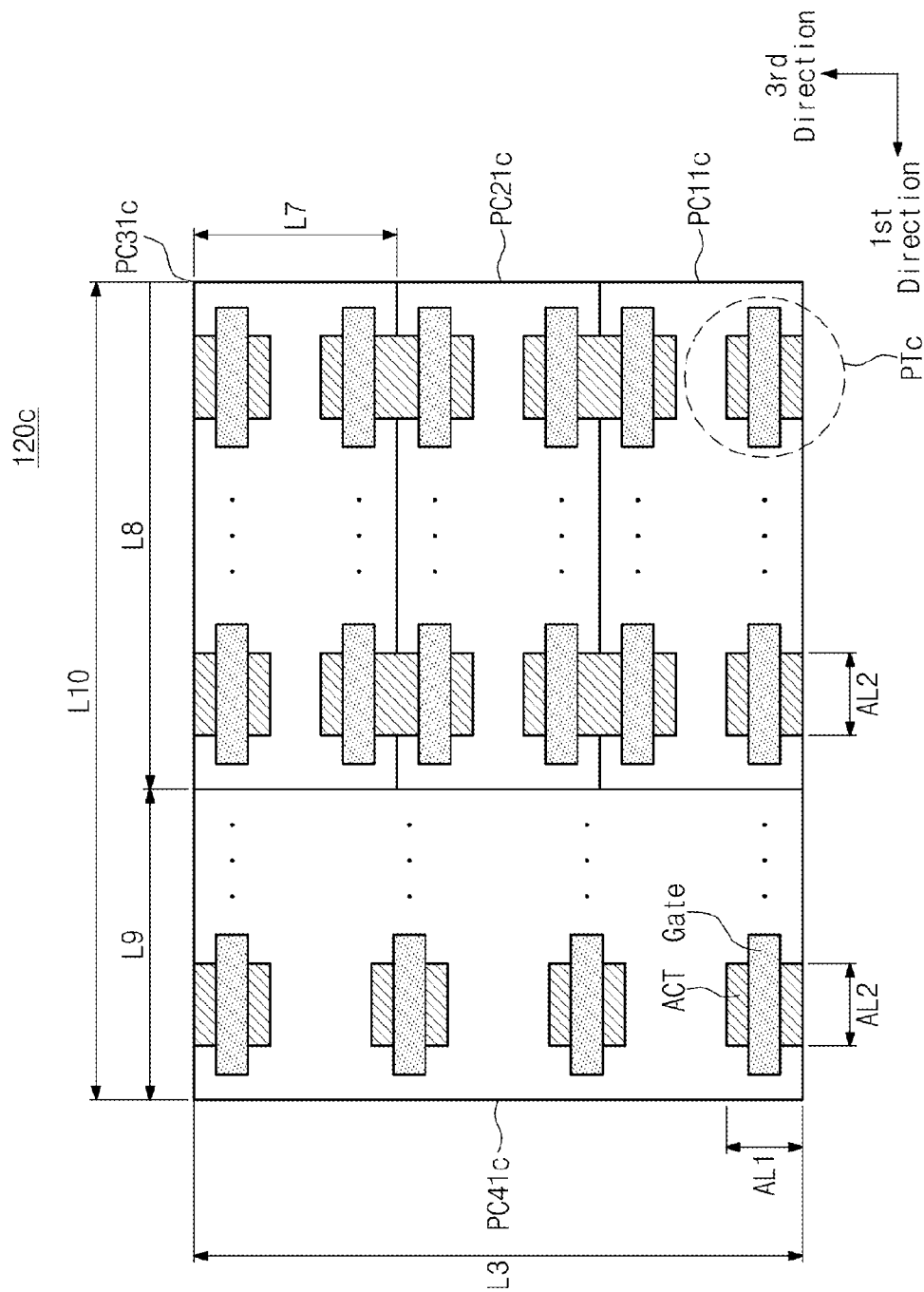
FIG. 16 is a plan view of pass circuits PC11c~PC41c in the layout of FIG. 15.

FIG. 15 illustrates another embodiment of a memory cell array and a block gating unit of FIG. 2. FIG. 16 illustrates the layout of pass circuits PC11c~PC41c of the block gating unit of FIG. 15.

Referring to FIGS. 15 and 16, pass circuits PC11c~PC41c and PC12c~PC42c may be disposed at both sides of the memory cell array 110c. In FIGS. 15 and 16, the memory cell array 110c include four memory blocks BLK1c~BLK4c but the memory cell array 110c is not limited thereto. The memory cell array 110c may include more than four memory blocks.

The memory blocks BLK1c~BLK4c may be operatively connected to the pass circuits PC11c~PC41c, respectively, and to the pass circuits PC12c~PC42c, respectively. That is, the first memory block BLK1c may be connected to the pass circuits PC11c and PC12c. The second memory block BLK2c may be connected to the pass circuits PC21c and PC22c. The third memory block BLK3c may be connected to the pass circuits PC31c and PC32c. The fourth memory block BLK4c may be connected to the pass circuits PC41c and PC42c. The memory blocks BLK1c~BLK4c can be connected to the pass circuits PC11c~PC41c and PC12c~PC42c by typical interconnection lines in general.

Each of the memory blocks BLK1c~BLK4c has a dimension L1 along the third direction like the memory blocks BLK1a~BLK4a of FIG. 11. Each of the pass circuits PC11c~PC41c and PC12c~PC42c has a dimension L7 along the third direction. The pass circuits PC41c and PC42c has a dimension three times L7 along the third direction.

Each of the pass circuits PC11c~PC41c and PC12c~PC42c has a dimension L8 along the first direction. Each of the pass circuits PC41c and PC42c has a dimension L9 along the first direction. Twice the dimension L9 may be equal to the dimension L8. Each group of the pass circuits PC11c~PC41c and PC12c~PC42c has a dimension L10 in the first direction. The dimension L10 may be equal to the sum of the dimension L8 and the dimension L9.

The pass circuits PC11c~PC31C may be arranged between the pass circuit PC41c and the memory cell array 110c. The pass circuits PC11c~PC31C may be arranged adjacent to one another along the third direction. The pass circuits PC12c~PC32C may be arranged between the pass circuit PC42c and the memory cell array 110c. The pass circuits PC12c~PC32C may be arranged adjacent to one another along the third direction.

As shown in FIG. 16, the pass transistors PTc of each of the pass circuits PC11c~PC41c may be arranged in two rows along the first direction. Each pass transistor PTc may include an active area ACT and a gate electrode crossing the active area ACT in the first direction. The active area ACT may include a source or a drain of each pass transistor PTc. The active area ACT has a dimension AL1 along the third direction, and a dimension AL2.

As mentioned above, the pass transistors PTc may be arranged in two rows in each pass circuit. Thus, the pass transistors PTc adjacent to one another in the third direction may belong to the same pass circuit. To prevent an error due to a breakdown voltage characteristic, the distance between the pass transistors operatively connected to the same memory block may be smaller than the distance between the pass transistors operatively connected to different memory blocks.

In FIG. 16, the pass transistors PTc of the pass circuit PC41 may be arranged in four rows. Thus, the distance between the pass transistors PTc along the third direction can be large enough to prevent an error due to a breakdown voltage.

On the other hand, the pass transistors PTc of the pass circuits PC11c and PC21c and the adjacent pass transistors PTc of the pass circuits PC21c and PC31c share a source and a drain. Therefore, there is no need to space these pass transistors PTc apart in the third direction. The pass transistors PTc of the pass circuits PC11c~PC41c can be supplied with the same gate voltage from the address decoder 130 (refer to FIG. 1).

The pass circuits PC12b~PC42b may be similarly arranged.

Figure 17:
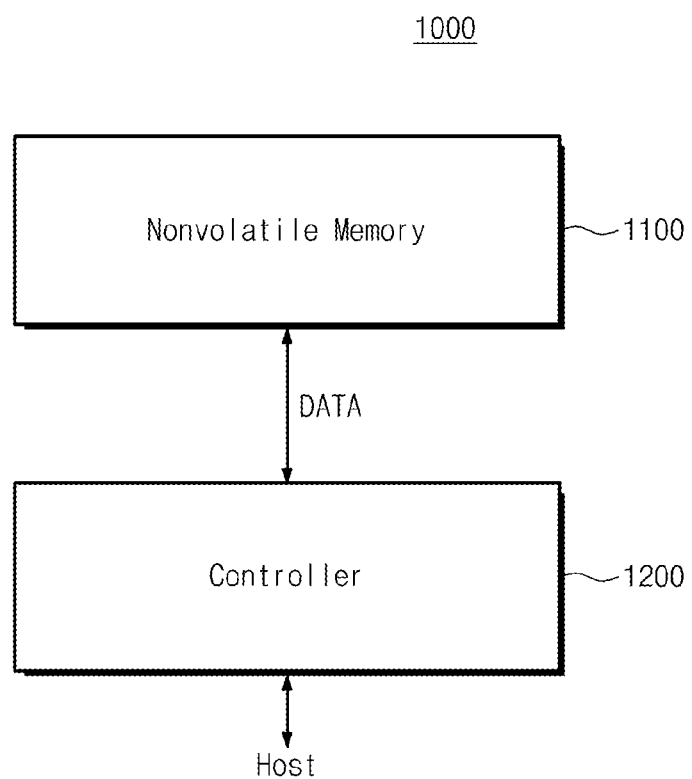
FIG. 17 is a block diagram illustrating a memory system in accordance with the inventive concept.

FIG. 17 illustrates a memory system in accordance with the inventive concept. Referring to FIG. 17, a memory system 1000 includes a nonvolatile memory device 1100 and a controller 1200.

The nonvolatile memory device 1100 may be any nonvolatile memory device 100 described with reference to FIGS. 1 through 16. As described with reference to FIGS. 1 through 16, the nonvolatile memory device 1100 may include a block gating unit having a minimal footprint due to its arrangement of pass circuits operatively connected to memory blocks. Thus, the footprint of the nonvolatile memory device 1100 may be correspondingly small or reduced.

The nonvolatile memory device 1100 may include at least one of an EEPROM (electrically erasable and programmable ROM), a flash memory, a PRAM (phase change RAM), an RRAM (resistive RAM), a FRAM (ferroelectric RAM), or the like.

The controller 1200 is connected to the nonvolatile memory device 1100. The controller 1200 is configured to access the nonvolatile memory device 1100. For example, the controller 1200 is configured to control read, write, erase and background operations of the nonvolatile memory device 1100. The controller 1200 is configured to provide an interface between the nonvolatile memory device 1100 and a host. The controller 1200 is configured to drive firmware for controlling the nonvolatile memory device 1100.

The controller 1200 can communicate with an external device (for example, a host) according to specific communication standards such as at least one of a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), and a Firewire.

The controller 1200 and the nonvolatile memory device 1100 can be integrated in one semiconductor device. For example, the controller 1200 and the nonvolatile memory device 1100 can be integrated in one semiconductor device to constitute a memory card such as a personal computer memory card international association (PCMCIA) card, a compact flash (CF) card, a smart media card (SM, SMC), a memory stick, a multimedia card (MMC, RS-MMC, MMC-micro), a SD card (SD, miniSD, microSD, or SDHC), or a universal flash memory device (UFS). The controller 1200 and the nonvolatile memory device 1100 can be integrated in one semiconductor device to constitute a solid state drive SSD. The solid state drive SSD includes a storage device configured to store data in a semiconductor memory. In the case that the memory system 1000 is used as a solid state drive SSD, an operation speed of a host connected to the memory system 1000 is greatly increased.

The memory system 1000 can constitute a computer, an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

The nonvolatile memory device 1100 or the memory system 1000 can be packaged in various ways so as to constitute a PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) or wafer-level processed stack package (WSP).

Figure 18:
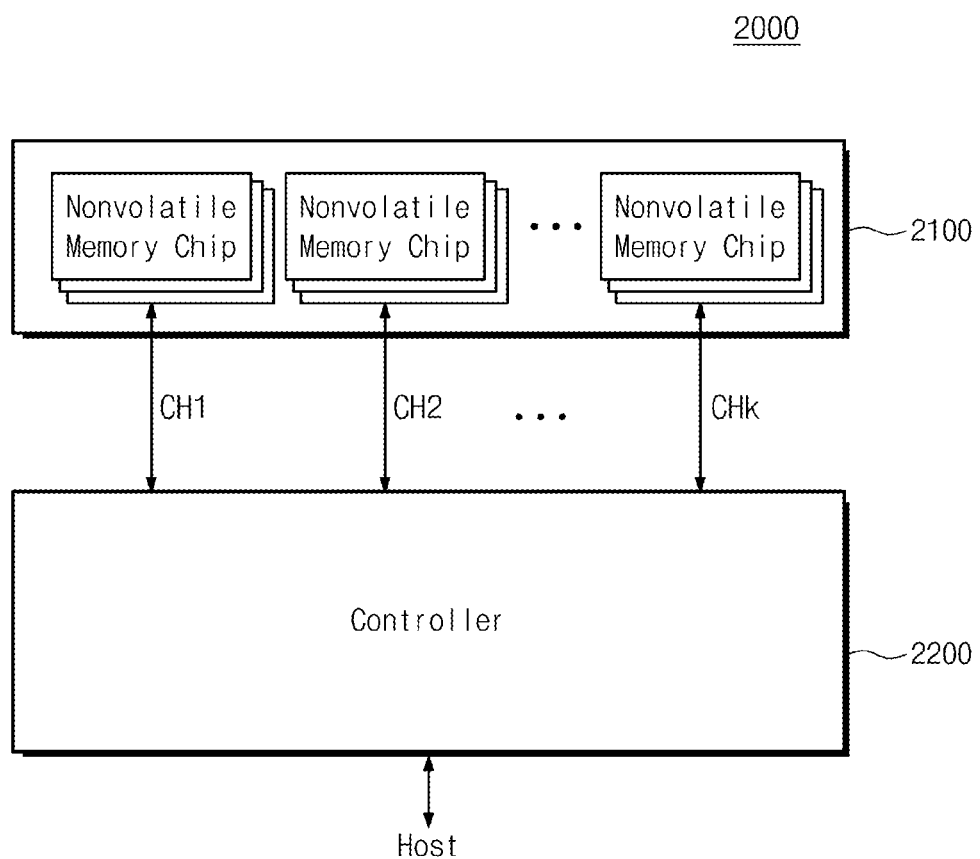
FIG. 18 is a block diagram illustrating a memory system in accordance with the inventive concept.

FIG. 18 illustrates a memory system in accordance with the inventive concept. Referring to FIG. 18, a memory system 2000 includes a nonvolatile memory device 2100 and a controller 2200. The nonvolatile memory device 2100 includes a plurality of nonvolatile memory chips. The nonvolatile memory chips are divided into a plurality of groups. Each group of the nonvolatile memory chips is configured to communicate with the controller 2200 through one common channel. The nonvolatile memory chips are illustrated to communicate with the controller 2200 through first through kth channels CH1~CHk.

Each nonvolatile memory chip may comprise any nonvolatile memory device 100 described with reference to FIGS. 1 through 16. Thus, each nonvolatile memory chip may include a block gating unit having a minimal footprint. Thus, the footprint of each nonvolatile memory chip may be correspondingly small or reduced.

In FIG. 18, a plurality of nonvolatile memory chips is connected to one channel. Alternatively, each nonvolatile memory chip may have its own dedicated channel.

Figure 19:
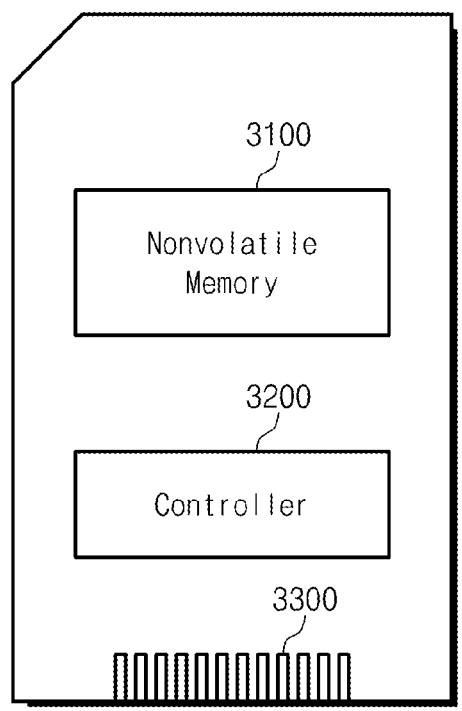
FIG. 19 illustrates a memory card in accordance with the inventive concept.

FIG. 19 illustrates a memory card in accordance with the inventive concept. Referring to FIG. 19, a memory card 3000 includes a nonvolatile memory device 3100, a controller 3200 and a connector 3300.

The nonvolatile memory device 3100 may be any nonvolatile memory device 100 described with reference to FIGS. 1 through 16. Thus, the nonvolatile memory device 3100 may include a block gating unit having a minimal footprint. Thus, the footprint of the nonvolatile memory device 3100 may be correspondingly small or reduced.

The connector 3300 can electrically connect the memory card 3000 to an external device (e.g., a host).

The memory card 3000 can constitute a memory card such as a personal computer memory card international association (PCMCIA) card, a compact flash (CF) card, a smart media card (SM, SMC), a memory stick, a multimedia card (MMC, RS-MMC, MMCmicro), an SD card (SD, miniSD, microSD, or SDHC), or a universal flash memory device (UFS).

Figure 20:
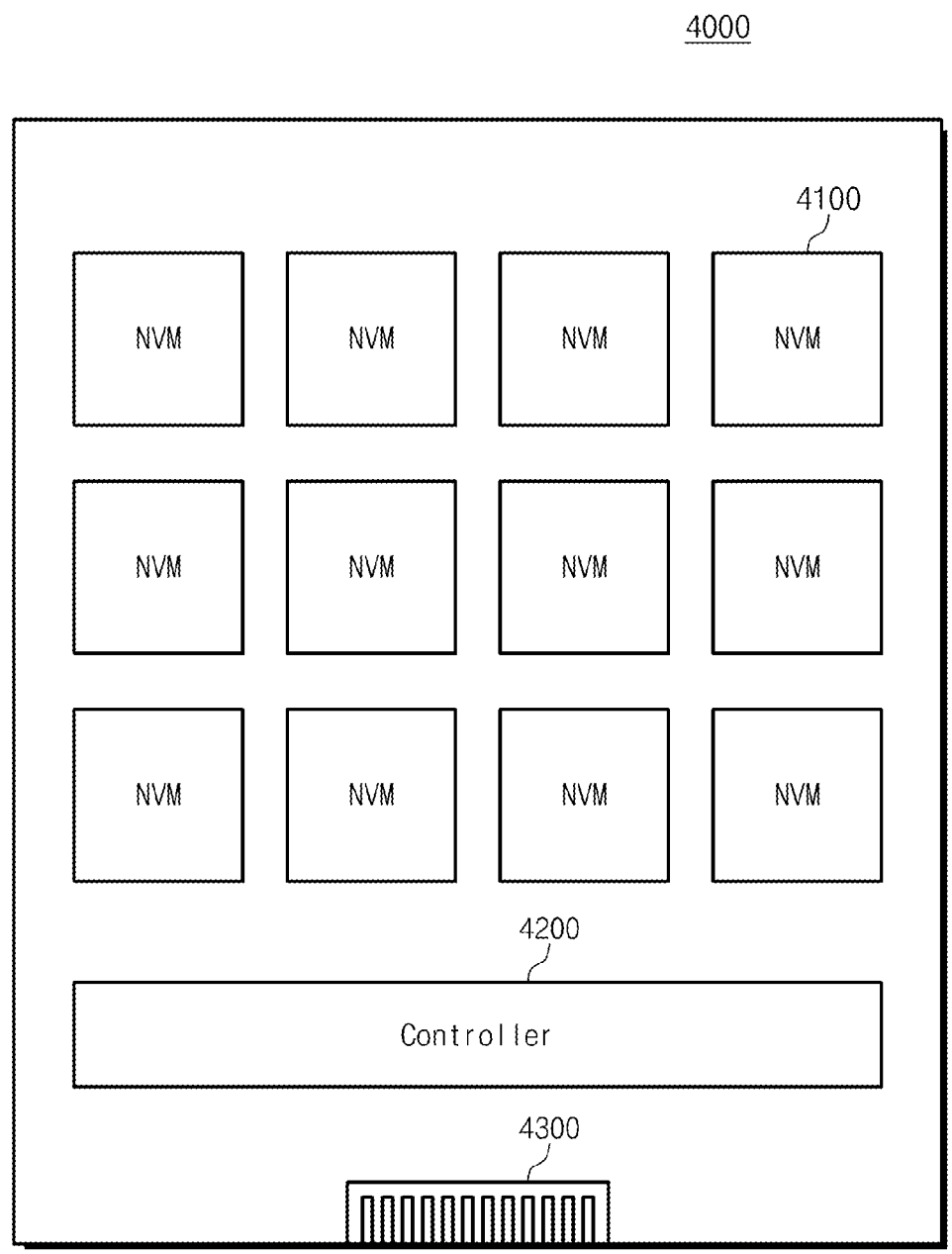
FIG. 20 illustrates a solid state drive SSD in accordance with the inventive concept.

FIG. 20 illustrates a solid state drive SSD in accordance with the inventive concept. Referring to FIG. 20, a solid state drive 4000 includes a plurality of nonvolatile memory devices 4100, a controller 4200 and a connector 4300.

The nonvolatile memory device 4100 may be any nonvolatile memory device described with reference to FIGS. 1 through 16. Thus, the nonvolatile memory device 4100 may include a block gating unit having a minimal footprint. Thus, the footprint of the nonvolatile memory device 4100 may be correspondingly small or reduced.

The connector 4300 can electrically connect the memory card 4000 to an external device (e.g., a host).

Figure 21:
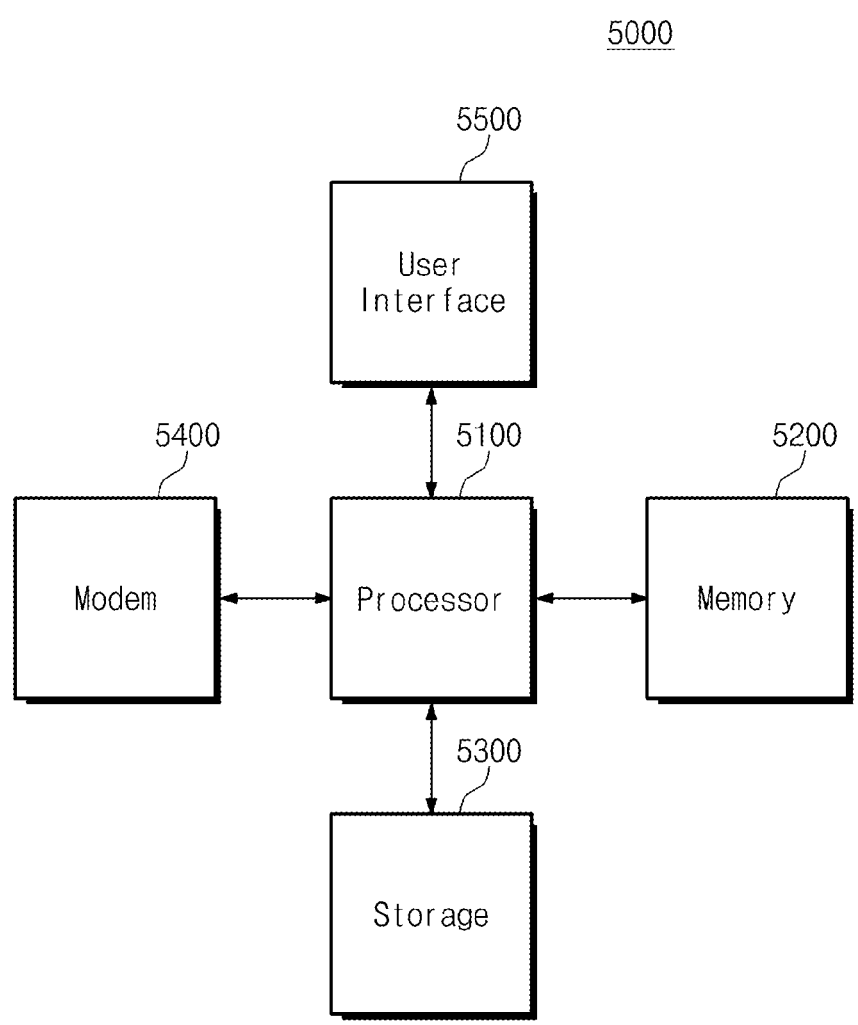
FIG. 21 illustrates a computing device in accordance with the inventive concept.

FIG. 21 illustrates a computing device in accordance with the inventive concept. Referring to FIG. 21, a computing device 5000 includes a processor 5100, a memory 5200, storage 5300, a modem 5400 and a user interface 5500.

The processor 5100 can control the overall operation of the computing device 5000 and perform a logical operation. For example, the processor 5100 may be constituted by a system-on-chip (SoC). The processor 5100 may be a general purpose processor or an application processor.

The memory 5200 can communicate with the processor 5100. The memory 5200 may be an operation memory (or main memory) of the processor 5100 or the computing device 5000. The memory 5200 may include a volatile memory device such as a SRAM, a DRAM, a SDRAM, or the like or a nonvolatile memory device such as a flash memory, a PRAM, a MRAM, an RRAM, a FRAM, or the like.

The storage 5300 can store data that is to be stored in the computing device 5000 for a long time. The storage 5300 may include a nonvolatile memory device such as a flash memory, a PRAM, a MRAM, an RRAM, a FRAM, or the like. In particular, the storage 5300 may comprise any nonvolatile memory device described with reference to FIGS. 1 through 16. Thus, the storage 5300 may include a block gating unit having a minimal footprint, and the footprint of the storage 5300 may be correspondingly small or reduced.

The memory 5200 and the storage 5300 may be constituted by the same kind of nonvolatile memory device. In this case, the memory 5200 and the storage 5300 can be constituted by one semiconductor integration circuit.

The modem 5400 can communicate with an external device under the control of the processor 5100. For example, the modem 5400 can perform a wired or wireless communication with an external device. The modem 5400 can perform a communication on the basis of at least one various wireless communication method such as a long term evolution (LTE), a WiMax, a global system for mobile communication (GSM), a code division multiple access (CDMA), a Bluetooth, a near field communication (NFC), a WiFi, a radio frequency Identification (RFID), or at least one of wired communication method such as a universal serial bus (USB), a serial at attachment (SATA), a small computer small interface (SCSI), a Firewire, or a peripheral component interconnection (PCI).

The user interface 5500 can communicate with a user under the control of the processor 5100. For example, the user interface 5500 may be a user input interface such as a keyboard, a keypad, a button, a touch panel, a touch screen, a touch pad, a touch ball, a camera, a mike, a gyroscope sensor, or a vibration sensor,. The user interface 5500 may include a user output interface such as a liquid crystal display (LCD), an organic light emitting diode (OLED) display, an active matrix OLED (AMOLED) display, a LED, a speaker, or a motor.

According to an aspect of the inventive concept, the footprint, i.e., the area occupied by a block gating unit, is minimized Thus, a nonvolatile memory device having an improved degree of integration may be provided.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A nonvolatile memory device comprising:
   first word lines and second word lines;
   a first memory block including first sets of memory cells and electrically connected to the first word lines, the memory cells of each first set being disposed at the same level in the device as one another and the first sets of memory cells being stacked vertically one atop another such that the first memory block contains a plurality of memory cells at each of a plurality of different levels arrayed in a vertical direction in the device;
   a second memory block including second sets of memory cells and electrically connected to the second word lines, the second memory block adjacent the first memory block in a first horizontal direction, the memory cells of each second set being disposed at the same level in the device as one another and the second sets of memory cells being stacked vertically one atop another such that the second memory block also contains a plurality of memory cells at each of a plurality of levels in the device;
   first pass transistors enabling a selection of the first word lines; and
   second pass transistors enabling a selection of the second word lines,
   wherein the first pass transistors and the second pass transistors are disposed beside the memory blocks and are arrayed two-dimensionally, in parallel rows, in a horizontal plane perpendicular to the vertical direction, each of the rows containing a plurality of respective ones of the pass transistors, the rows spaced apart from each other in the first horizontal direction, and each of the rows of the pass transistors extending in a second horizontal direction different from the first horizontal direction,
   the memory cells of the first and second memory blocks are arrayed in parallel rows spaced from each other in the first horizontal direction, and each of the rows of memory cells containing a plurality of respective ones of the memory cells and extending in the second horizontal direction, and
   each of the first pass transistors is located between each of the second pass transistors and the first memory block.

2. The nonvolatile memory device of claim 1, further comprising:
   third pass transistors enabling a selection of the first word lines; and
   fourth pass transistors enabling a selection of the second word lines, and
   wherein the third pass transistors and the fourth pass transistors are disposed beside the memory blocks and are arrayed in parallel rows each extending in the second horizontal direction.

3. The nonvolatile memory device of claim 2, wherein the first pass transistors and the second pass transistors are disposed to one side of the memory blocks, and the third pass transistors and the fourth pass transistors are disposed on the opposite side of the memory blocks.

4. The nonvolatile memory device of claim 1, wherein the first and second memory blocks each have a dimension as measured in the first direction, and
   a first pass circuit unit of the first pass transistors or a second pass circuit of the second pass transistors has a first dimension, as measured in the first direction, which is twice that of each of the first and second memory blocks.

5. The nonvolatile memory device of claim 4, wherein the first pass transistors or the second pass transistors are arrayed in columns each extending in the first direction and containing a plurality of said first pass transistors or second pass transistors.

6. A nonvolatile memory device comprising:
   a plurality of word lines;
   a group of memory blocks connected to the plurality of word lines, each of the memory blocks including sets of memory cells, the memory cells of each set being disposed at the same level in the device as one another and the sets of memory cells being stacked vertically one atop such that each of the memory blocks contains a plurality of memory cells at each of a plurality of different levels arrayed in a vertical direction in the device; and
   a plurality of pass transistor units,
   wherein each of the pass transistor units is disposed beside the group of memory blocks so as to face the group of memory blocks in a horizontal direction, and each of the pass transistor units comprises a plurality of pass transistors,
   the pass transistors constituting the pass transistor units collectively are disposed in a two-dimensional array in a horizontal plane perpendicular to the vertical direction, and
   the pass transistor units enable the memory blocks, respectively.

7. The nonvolatile memory device of claim 6, wherein the plurality of memory blocks include first, second, third and fourth memory blocks,
   the plurality of word lines include first word lines connected to the first memory block, second word lines connected to the second memory block, third word lines connected to the third memory block, and fourth word lines connected to the fourth memory block, the pass transistor units comprise first, second, third and fourth pass transistor units connected to the first, second, third and fourth word lines, respectively, and the first, second and third pass transistor units are interposed between the fourth pass transistor unit and the group of memory blocks.

8. The nonvolatile memory device of claim 7, wherein the memory blocks are arrayed in a first direction, and the first through third pass transistor units are arrayed in the first direction.

9. The nonvolatile memory device of claim 8, wherein each of the pass transistor units includes a plurality of respective ones of the pass transistors, and in each of the pass transistor units, the pass transistors of are arrayed in columns each extending in the first direction.

10. The nonvolatile memory device of claim 7, wherein the pass transistor units further comprise fifth, sixth, seventh and eighth pass transistor units connected to the first, second, third and fourth word lines, respectively, and the fifth, sixth and seventh pass transistor units are interposed between the eighth pass transistor unit and the group of memory blocks.

11. The nonvolatile memory device of claim 10, wherein the fifth, sixth, seventh and eighth pass transistor units are disposed on an opposite side of the group of memory blocks from the first, second, third and fourth pass transistor units.

12. The nonvolatile memory device of claim 11, wherein the memory blocks are arrayed in a first direction, and the fifth, sixth and seventh pass transistor units are arrayed in the first direction.

13. The nonvolatile memory device of claim 8, wherein in each of the fifth, sixth, seventh and eighth pass transistor units, the pass transistors are arrayed in a second direction perpendicular to the first direction.

14. The nonvolatile memory device of claim 7, wherein the memory blocks are arrayed in a first direction, each of the memory blocks has a dimension as measured along the first direction, and each of the first, second and third pass transistor units has a dimension, along the first direction, greater than but less than twice that of each of the memory blocks.

15. A nonvolatile memory device comprising:

a memory cell array comprising blocks of cell strings, the blocks disposed side by side in a first direction in a horizontal plane, and each of the cell strings including a stack of respective memory transistors disposed one on another in a vertical direction perpendicular to the horizontal plane, and wherein each of the blocks has a plurality of the memory transistors located at each of a plurality of different levels arrayed in the vertical direction in the memory device, groups of word lines connected to the blocks, respectively, wherein the word lines of each group are electrically connected to the memory transistors of a respective one of the blocks of cell strings;

a block gating unit including a plurality of circuits of pass transistors, and wherein each of the circuits of pass transistors is connected to one of the blocks of cell strings, respective ones of the pass transistors of the block gating unit are connected to the groups of word lines, each of the circuits of pass transistors is disposed beside the blocks of cell strings along a second direction extending perpendicular to the first direction and the vertical direction, and all of said pass transistors are disposed at the same level as one another in the memory device as arrayed in rows and columns in the first and second directions, respectively.

16. The nonvolatile memory device of claim 15, wherein the blocks of cell strings include first, second, third and fourth blocks of cell strings arrayed in the first direction in the foregoing order, the pass transistor circuits of the blocking gating unit include first, second, third and fourth pass transistor circuits disposed beside the first, second, third and fourth blocks of cell strings, respectively.

17. The nonvolatile memory device of claim 15, wherein the blocks of cell strings include first, second, third and fourth blocks of cell strings arrayed in the first direction in the foregoing order, the pass transistor circuits of the blocking gating unit include first, second, third and fourth pass transistor circuits disposed beside the first, second, third and fourth blocks of cell strings, respectively.

18. The nonvolatile memory device of claim 15, wherein the blocks of cell strings include first, second, third and fourth blocks of cell strings arrayed in the first direction in the foregoing order, the pass transistor circuits of the blocking gating unit include first, second, third and fourth pass transistor circuits, the first and second pass transistors circuits are disposed side by side along the second direction and are each disposed beside both the first and second blocks of cell strings, and the third and fourth pass transistors circuits are disposed side by side along the second direction and are each disposed beside both the third and fourth blocks of cell strings.

19. The nonvolatile memory device of claim 15, wherein the blocks of cell strings include first, second, third and fourth blocks of cell strings arrayed in the first direction in the foregoing order, the pass transistor circuits of the blocking gating unit include first, second, third and fourth pass transistor circuits, the first, second and third pass transistors circuits are arrayed in the first direction and are collectively disposed beside all four of the blocks of cell strings, and the first, second and third pass transistors circuits are interposed in the first direction between the fourth pass transistor circuit and all four of the blocks of cell strings.

* * * * *